US009349929B2

(12) United States Patent
Clark et al.

(10) Patent No.: US 9,349,929 B2
(45) Date of Patent: May 24, 2016

(54) LIGHT EMITTER PACKAGES, SYSTEMS, AND METHODS

(71) Applicant: CREE, Inc., Durham, NC (US)

(72) Inventors: Joseph G. Clark, Raleigh, NC (US); Amber C. Abare, Durham, NC (US); David T. Emerson, Chapel Hill, NC (US); Jeremy S. Nevins, Cary, NC (US); Raymond Rosado, Apex, NC (US); Michael Bergmann, Raleigh, NC (US)

(73) Assignee: Cree, Inc., Durham, NC (US)

( * ) Notice: Subject to any disclaimer, the term of this patent is extended or adjusted under 35 U.S.C. 154(b) by 337 days.

(21) Appl. No.: 13/713,410

(22) Filed: Dec. 13, 2012

(65) Prior Publication Data

US 2013/0322070 A1 Dec. 5, 2013

Related U.S. Application Data

(63) Continuation-in-part of application No. 29/423,422, filed on May 31, 2012, now Pat. No. Des. 709,464, and a continuation-in-part of application No. 13/554,776, filed on Jul. 20, 2012.

(60) Provisional application No. 61/653,809, filed on May 31, 2012, provisional application No. 61/665,057, filed on Jun. 27, 2012, provisional application No. 61/669,738, filed on Jul. 10, 2012.

(51) Int. Cl.

| | |
|---|---|
| ***H01L 33/58*** | (2010.01) |
| ***F21V 21/00*** | (2006.01) |
| ***H01L 33/50*** | (2010.01) |
| ***F21V 7/00*** | (2006.01) |
| ***H01L 25/075*** | (2006.01) |
| *H01L 33/54* | (2010.01) |
| *F21K 99/00* | (2016.01) |

(Continued)

(52) U.S. Cl.

CPC . *H01L 33/58* (2013.01); *F21V 7/00* (2013.01); *F21V 21/00* (2013.01); *H01L 25/0753* (2013.01); *F21K 9/137* (2013.01); *F21Y 2101/02* (2013.01); *F21Y 2105/001* (2013.01); *H01L 33/50* (2013.01); *H01L 33/54* (2013.01); *H01L 2224/48091* (2013.01)

(58) Field of Classification Search

None

See application file for complete search history.

(56) References Cited

U.S. PATENT DOCUMENTS 4,946,547 A 8/1990 Palmour
5,200,022 A 4/1993 Kong (Continued)

FOREIGN PATENT DOCUMENTS

CN ZL201230586339.6 7/2013
CN 302758425 S 3/2014

(Continued)

OTHER PUBLICATIONS

Non-Final Office Action for U.S. Appl. No. 13/554,776 dated Jan. 12, 2015.

(Continued)

*Primary Examiner* — Ashok Patel

(74) *Attorney, Agent, or Firm* — Jenkins, Wilson, Taylor & Hunt, P.A.

(57) ABSTRACT

Light emitter packages, systems, and methods having improved performance are disclosed. In one aspect, a light emitter package can include a submount that can include an anode and a cathode. A first light emitter chip can mounted over at least a portion of the cathode, and a second light emitter chip can be wirebonded to at least a portion of the anode. Multiple light emitter chips can be disposed between the first and second light emitter chips.

27 Claims, 11 Drawing Sheets

(51) Int. Cl.

| | |
|---|---|
| *F21Y 101/02* | (2006.01) |
| *F21Y 105/00* | (2016.01) |

(56) References Cited

U.S. PATENT DOCUMENTS

| | | | | |
|---|---|---|---|---|
| RE34,861 | E | 2/1995 | Davis | |
| 7,213,940 | B1 | 5/2007 | Van De Ven | |
| D615,504 | S | 5/2010 | Keller et al. | |
| 7,791,061 | B2 | 9/2010 | Edmond | |
| D628,966 | S | 12/2010 | Kuwaharada et al. | |
| D631,020 | S | 1/2011 | Chuang et al. | |
| 8,058,088 | B2 | 11/2011 | Cannon | |
| D650,343 | S | 12/2011 | Andrews et al. | |
| D658,139 | S | 4/2012 | Andrews et al. | |
| D660,257 | S | 5/2012 | Andrews et al. | |
| D674,758 | S | 1/2013 | Wu et al. | |
| D675,169 | S | 1/2013 | Chou | |
| 8,575,734 | B2 | 11/2013 | Shin | |
| 8,610,145 | B2 | 12/2013 | Yano | |
| D709,464 | S | 7/2014 | Abare et al. | |
| D711,841 | S | 8/2014 | Britt et al. | |
| D713,804 | S | 9/2014 | Britt et al. | |
| 2004/0262738 | A1 | 12/2004 | Lee et al. | |
| 2007/0158668 | A1 | 7/2007 | Tarsa | |
| 2008/0001160 | A1* | 1/2008 | Andrews | 257/79 |
| 2008/0026498 | A1* | 1/2008 | Tarsa et al. | 438/26 |
| 2008/0035947 | A1 | 2/2008 | Weaver Jr. et al. | |
| 2008/0054286 | A1 | 3/2008 | Loh et al. | |
| 2008/0074029 | A1 | 3/2008 | Suehiro | |
| 2008/0173884 | A1 | 7/2008 | Chitnis | |
| 2008/0179611 | A1 | 7/2008 | Chitnis | |
| 2008/0258130 | A1 | 10/2008 | Bergmann | |
| 2008/0290352 | A1 | 11/2008 | Park | |
| 2009/0050907 | A1 | 2/2009 | Yuan et al. | |
| 2009/0108281 | A1 | 4/2009 | Keller et al. | |
| 2009/0146159 | A1 | 6/2009 | Park et al. | |
| 2010/0140634 | A1 | 6/2010 | Van De Ven et al. | |
| 2010/0155748 | A1 | 6/2010 | Chan et al. | |
| 2010/0155763 | A1 | 6/2010 | Donofrio | |
| 2010/0207534 | A1 | 8/2010 | Dowling et al. | |
| 2010/0237377 | A1* | 9/2010 | Park | 257/98 |
| 2010/0237775 | A1 | 9/2010 | Chao | |
| 2010/0252851 | A1 | 10/2010 | Emerson et al. | |
| 2010/0277919 | A1 | 11/2010 | Okada et al. | |
| 2011/0012143 | A1 | 1/2011 | Yuan et al. | |
| 2011/0062482 | A1 | 3/2011 | Solomensky et al. | |
| 2011/0127912 | A1 | 6/2011 | Lee et al. | |
| 2011/0220920 | A1 | 9/2011 | Collins et al. | |
| 2011/0220926 | A1* | 9/2011 | Kim | 257/91 |
| 2012/0069564 | A1 | 3/2012 | Andrews et al. | |
| 2012/0086024 | A1 | 4/2012 | Andrews et al. | |
| 2012/0199852 | A1 | 8/2012 | Lowes et al. | |
| 2012/0286304 | A1 | 11/2012 | LeToquin et al. | |
| 2012/0305949 | A1 | 12/2012 | Donofrio | |
| 2012/0326159 | A1 | 12/2012 | Bergmann | |
| 2013/0092960 | A1 | 4/2013 | Wilcox et al. | |
| 2013/0105835 | A1 | 5/2013 | Wu et al. | |
| 2013/0322068 | A1* | 12/2013 | Clark et al. | 362/235 |
| 2013/0322070 | A1 | 12/2013 | Clark et al. | |

FOREIGN PATENT DOCUMENTS

| | | |
|---|---|---|
| CN | ZL201330525210.9 | 6/2014 |
| CN | ZL201330525357.8 | 6/2014 |
| CN | ZL201330525231.0 | 7/2014 |
| DE | 102007029369 A1 | 1/2009 |
| EP | 2856524 | 4/2015 |
| EP | 2856525 | 4/2015 |
| JP | 2002-057374 | 2/2002 |
| JP | 2003-258310 | 9/2003 |
| JP | 2008-034513 | 2/2008 |
| WO | WO 2013/181538 | 12/2013 |

OTHER PUBLICATIONS

Notice of Allowance for U.S. Appl. No. 29/439,629 dated Jan. 16, 2015.

Chinese Notice of Grant for Application No. 201230586339.6 dated Apr. 15, 2013.

"High Flux Density and Efficacy," Luxeon M Datasheet DSI03, 2012, pp. 1-22, Philips Lumileds Company, United States.

Shchekin, Oleg et al., "Evolutionary new chip design targets lighting systems," Compound Semiconductor, Mar. 2007, vol. 13 No. 2, Institute of Physics Publishing and IOP Publishing Ltd.

Chinese Notice of Issuance for Application No. 201330525210.9 dated Feb. 19, 2014.

Notice of Allowance for U.S. Appl. No. 29/439,629 dated Feb. 19, 2014.

Chinese Notice of Allowance for Application No. 201330525231.0 dated Apr. 10, 2014.

Non-Final Office Action for U.S. Appl. No. 13/554,776 dated Apr. 24, 2014.

Notice of Allowance for U.S. Appl. No. 29/439,629 dated May 28, 2014.

Restriction Requirement for U.S. Appl. No. 13/554,776 dated Jun. 14, 2013.

Chinese Office Action for Application No. 201330248426.5 dated Aug. 19, 2013.

U.S. Appl. No. 29/491,974 filed May 27, 2014.

Supplemental Notice of Allowability for U.S. Appl. No. 29/439,629 dated Sep. 4, 2014.

Notice of Allowance for U.S. Appl. No. 29/439,629 dated Oct. 7, 2014.

International Search Report and Written Opinion for Application No. PCT/US2013/043618 dated Sep. 25, 2013.

International Search Report and Written Opinion for Application No. PCT/US2013/043619 dated Sep. 26, 2013.

Restriction Requirement for U.S. Appl. No. 29/423,422 dated Sep. 30, 2013.

Restriction Requirement for U.S. Appl. No. 29/439,629 dated Sep. 30, 2013.

Notice of Issuance for Application No. 201330248426.5 dated Nov. 19, 2013.

Notice of Allowance for U.S. Appl. No. 29/423,422 dated Nov. 19, 2013.

Notice of Allowance for U.S. Appl. No. 29/439,629 dated Nov. 27, 2013.

Chinese Office Action for Application No. 201330525231.0 dated Jan. 13, 2014.

Notice of Allowance for U.S. Appl. No. 29/423,422 dated Mar. 3, 2014.

Chinese Notice of Issuance for Application No. 201330525357.8 dated Feb. 19, 2014.

Notice of Allowance for U.S. Appl. No. 29/439,629 dated May 22, 2015.

Notice of Allowance for U.S. Appl. No. 29/491,974 dated Aug. 4, 2015.

Final Office Action for U.S. Appl. No. 13/554,776 dated Aug. 21, 2015.

Notice of Allowance for U.S. Appl. No. 29/439,629 dated Sep. 10, 2015.

* cited by examiner

WW STANDARD CRI

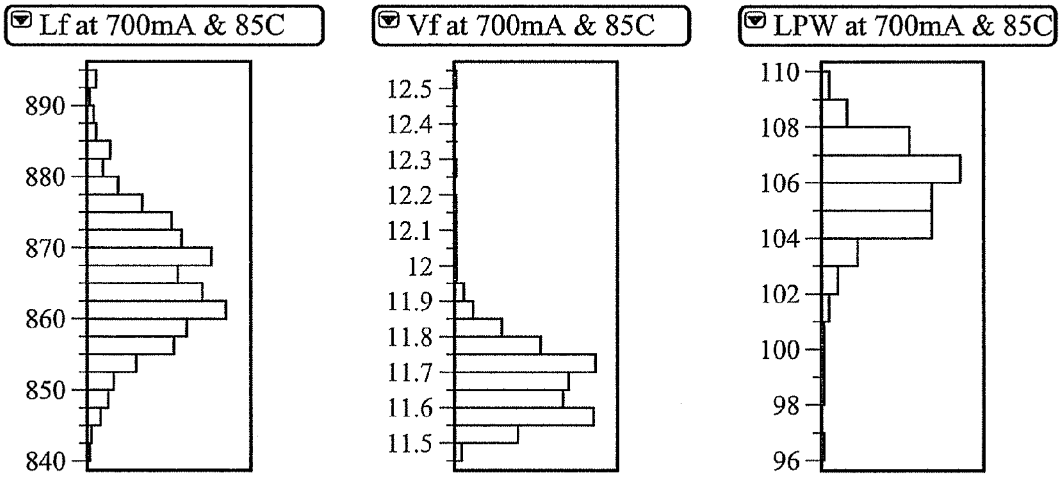

Lf at 700mA & 85C

Quantiles

| | | |
|---|---|---|
| 100.0% | maximum | 894.07 |
| 99.5% | | 893.70 |
| 97.5% | | 885.40 |
| 90.0% | | 877.08 |
| 75.0% | quartile | 871.74 |
| 50.0% | median | 864.97 |
| 25.0% | quartile | 858.98 |
| 10.0% | | 854.62 |
| 2.5% | | 847.94 |
| 0.5% | | 843.25 |
| 0.0% | minimum | 841.73 |

Moments

| | |
|---|---|
| Mean | 865.59353 |
| Std Dev | 9.2997137 |
| Std Err Mean | 0.3719885 |
| upper 95% Mean | 866.32403 |
| lower 95% Mean | 864.86303 |

Vf at 700mA & 85C

Quantiles

| | | |
|---|---|---|
| 100.0% | maximum | 12.537 |
| 99.5% | | 12.276 |
| 97.5% | | 11.931 |
| 90.0% | | 11.815 |
| 75.0% | quartile | 11.746 |
| 50.0% | median | 11.673 |
| 25.0% | quartile | 11.590 |
| 10.0% | | 11.550 |
| 2.5% | | 11.513 |
| 0.5% | | 11.490 |
| 0.0% | minimum | 11.485 |

Moments

| | |
|---|---|
| Mean | 11.682423 |
| Std Dev | 0.1191878 |
| Std Err Mean | 0.0047675 |
| upper 95% Mean | 11.691785 |
| lower 95% Mean | 11.673061 |

LPW at 700mA & 85C

Quantiles

| | | |
|---|---|---|
| 100.0% | maximum | 109.60 |
| 99.5% | | 109.36 |
| 97.5% | | 108.68 |
| 90.0% | | 107.69 |
| 75.0% | quartile | 106.90 |
| 50.0% | median | 105.87 |
| 25.0% | quartile | 104.63 |
| 10.0% | | 103.73 |
| 2.5% | | 102.04 |
| 0.5% | | 99.69 |
| 0.0% | minimum | 96.83 |

Moments

| | |
|---|---|
| Mean | 105.7191 |
| Std Dev | 1.6826355 |
| Std Err Mean | 0.0673054 |
| upper 95% Mean | 105.85128 |
| lower 95% Mean | 105.58693 |

FIG. 7A

WW STANDARD CRI

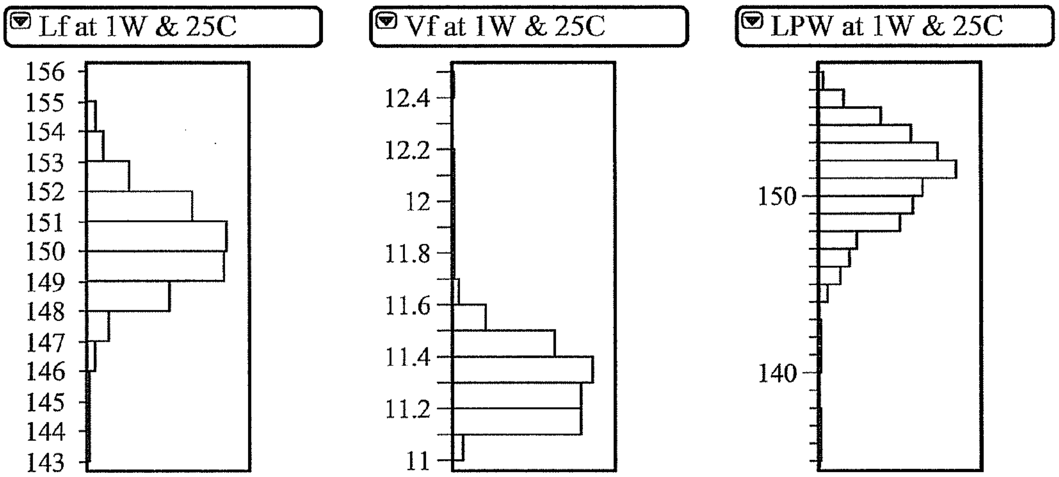

Lf at 1W & 25C

Quantiles

| | | |
|---|---|---|
| 100.0% | maximum | 154.99 |
| 99.5% | | 154.92 |
| 97.5% | | 153.51 |
| 90.0% | | 152.18 |
| 75.0% | quartile | 151.27 |
| 50.0% | median | 150.18 |
| 25.0% | quartile | 149.19 |
| 10.0% | | 148.45 |
| 2.5% | | 147.04 |
| 0.5% | | 145.67 |
| 0.0% | minimum | 143.30 |

Moments

| | |
|---|---|
| Mean | 150.25128 |
| Std Dev | 1.602581 |
| Std Err Mean | 0.0631996 |
| upper 95% Mean | 150.37538 |
| lower 95% Mean | 150.12718 |

Vf at 1W & 25C

Quantiles

| | | |
|---|---|---|
| 100.0% | maximum | 12.427 |
| 99.5% | | 12.087 |
| 97.5% | | 11.663 |
| 90.0% | | 11.496 |
| 75.0% | quartile | 11.405 |
| 50.0% | median | 11.309 |
| 25.0% | quartile | 11.199 |
| 10.0% | | 11.152 |
| 2.5% | | 11.103 |
| 0.5% | | 11.074 |
| 0.0% | minimum | 11.068 |

Moments

| | |
|---|---|
| Mean | 11.322659 |
| Std Dev | 0.1560566 |
| Std Err Mean | 0.0061543 |
| upper 95% Mean | 11.334743 |
| lower 95% Mean | 11.310574 |

LPW at 1W & 25C

Quantiles

| | | |
|---|---|---|
| 100.0% | maximum | 156.54 |
| 99.5% | | 156.16 |
| 97.5% | | 155.21 |
| 90.0% | | 154.11 |
| 75.0% | quartile | 152.79 |
| 50.0% | median | 151.27 |
| 25.0% | quartile | 149.16 |
| 10.0% | | 147.45 |
| 2.5% | | 144.84 |
| 0.5% | | 138.39 |
| 0.0% | minimum | 135.23 |

Moments

| | |
|---|---|
| Mean | 150.82759 |
| Std Dev | 2.8355341 |
| Std Err Mean | 0.1118225 |
| upper 95% Mean | 151.04717 |
| lower 95% Mean | 150.608 |

FIG. 7B

CW STANDARD CRI

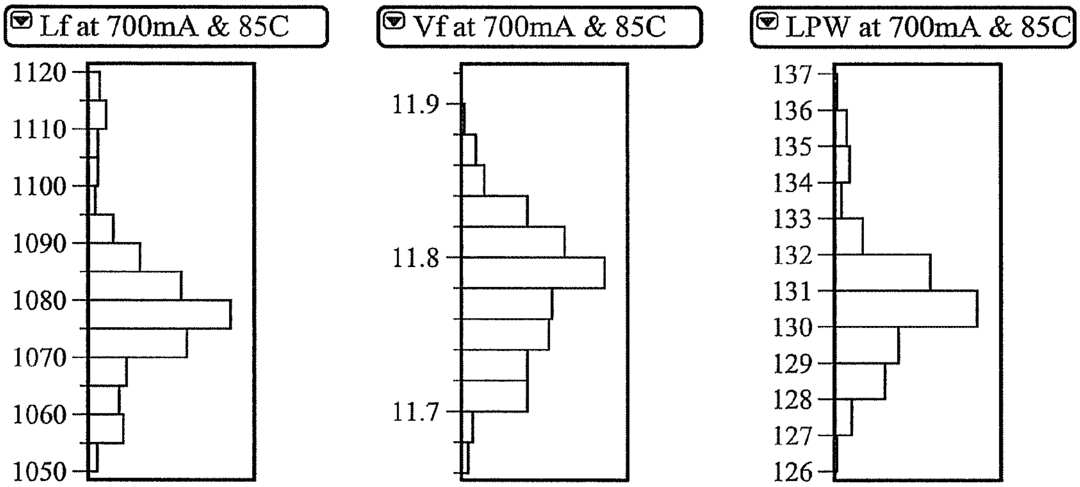

Lf at 700mA & 85C — Quantiles

| | | |
|---|---|---|
| 100.0% | maximum | 1118.7 |
| 99.5% | | 1118.5 |
| 97.5% | | 1115.1 |
| 90.0% | | 1095.9 |
| 75.0% | quartile | 1084.3 |
| 50.0% | median | 1077.7 |
| 25.0% | quartile | 1072.3 |
| 10.0% | | 1062.5 |
| 2.5% | | 1057.3 |
| 0.5% | | 1050.7 |
| 0.0% | minimum | 1050.3 |

Lf at 700mA & 85C — Moments

| | |
|---|---|
| Mean | 1079.2598 |
| Std Dev | 13.451503 |
| Std Err Mean | 0.8947807 |
| upper 95% Mean | 1081.023 |
| lower 95% Mean | 1077.4966 |

Vf at 700mA & 85C — Quantiles

| | | |
|---|---|---|
| 100.0% | maximum | 11.900 |
| 99.5% | | 11.896 |
| 97.5% | | 11.866 |
| 90.0% | | 11.829 |
| 75.0% | quartile | 11.807 |
| 50.0% | median | 11.783 |
| 25.0% | quartile | 11.745 |
| 10.0% | | 11.714 |
| 2.5% | | 11.699 |
| 0.5% | | 11.677 |
| 0.0% | minimum | 11.677 |

Vf at 700mA & 85C — Moments

| | |
|---|---|
| Mean | 11.777492 |
| Std Dev | 0.0433359 |
| Std Err Mean | 0.0028827 |
| upper 95% Mean | 11.783173 |
| lower 95% Mean | 11.771812 |

LPW at 700mA & 85C — Quantiles

| | | |
|---|---|---|
| 100.0% | maximum | 136.07 |
| 99.5% | | 136.06 |
| 97.5% | | 135.54 |
| 90.0% | | 132.88 |
| 75.0% | quartile | 131.67 |
| 50.0% | median | 130.47 |
| 25.0% | quartile | 129.79 |
| 10.0% | | 128.58 |
| 2.5% | | 127.66 |
| 0.5% | | 126.73 |
| 0.0% | minimum | 126.68 |

LPW at 700mA & 85C — Moments

| | |
|---|---|
| Mean | 130.72814 |
| Std Dev | 1.7587851 |
| Std Err Mean | 0.1169926 |
| upper 95% Mean | 130.95868 |
| lower 95% Mean | 130.4976 |

FIG. 8A

CW STANDARD CRI

Lf at 1W & 25C

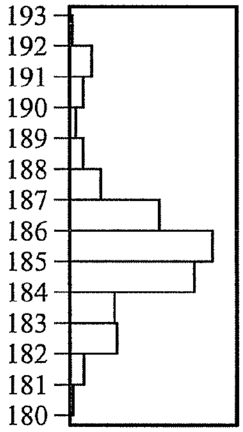

Quantiles

| | | |
|---|---|---|
| 100.0% | maximum | 192.04 |
| 99.5% | | 192.01 |
| 97.5% | | 191.46 |
| 90.0% | | 188.29 |
| 75.0% | quartile | 186.37 |
| 50.0% | median | 185.27 |
| 25.0% | quartile | 184.39 |
| 10.0% | | 182.78 |
| 2.5% | | 181.92 |
| 0.5% | | 180.82 |
| 0.0% | minimum | 180.76 |

Moments

| | |
|---|---|
| Mean | 185.53906 |
| Std Dev | 2.2192376 |
| Std Err Mean | 0.1476215 |
| upper 95% Mean | 185.82996 |
| lower 95% Mean | 185.24817 |

Vf at 1W & 25C

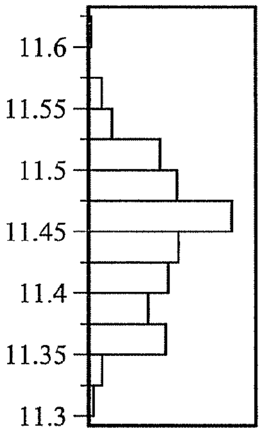

Quantiles

| | | |
|---|---|---|
| 100.0% | maximum | 11.603 |
| 99.5% | | 11.599 |
| 97.5% | | 11.559 |
| 90.0% | | 11.512 |
| 75.0% | quartile | 11.483 |
| 50.0% | median | 11.452 |
| 25.0% | quartile | 11.403 |
| 10.0% | | 11.364 |
| 2.5% | | 11.344 |
| 0.5% | | 11.315 |
| 0.0% | minimum | 11.315 |

Moments

| | |
|---|---|
| Mean | 11.4445193 |
| Std Dev | 0.0559992 |
| Std Err Mean | 0.003725 |
| upper 95% Mean | 11.452533 |
| lower 95% Mean | 11.437852 |

LPW at 1W & 25C

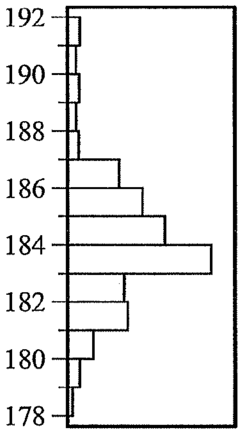

Quantiles

| | | |
|---|---|---|
| 100.0% | maximum | 191.74 |
| 99.5% | | 191.73 |
| 97.5% | | 191.03 |
| 90.0% | | 187.11 |
| 75.0% | quartile | 185.70 |
| 50.0% | median | 183.92 |
| 25.0% | quartile | 182.75 |
| 10.0% | | 181.20 |
| 2.5% | | 179.84 |
| 0.5% | | 178.52 |
| 0.0% | minimum | 178.46 |

Moments

| | |
|---|---|
| Mean | 184.22274 |
| Std Dev | 2.4884031 |
| Std Err Mean | 0.1655261 |
| upper 95% Mean | 184.54892 |
| lower 95% Mean | 183.89656 |

LPW at 1W & 25C

Quantiles

| | | |
|---|---|---|
| 100.0% | maximum | 202.42 |
| 99.5% | | 202.42 |
| 97.5% | | 200.92 |
| 90.0% | | 198.07 |
| 75.0% | quartile | 195.55 |
| 50.0% | median | 193.37 |
| 25.0% | quartile | 191.81 |
| 10.0% | | 190.71 |
| 2.5% | | 189.78 |
| 0.5% | | 188.36 |
| 0.0% | minimum | 188.36 |

Moments

| | |
|---|---|
| Mean | 193.88824 |
| Std Dev | 2.8538123 |
| Std Err Mean | 0.2605162 |
| upper 95% Mean | 194.40409 |
| lower 95% Mean | 193.37239 |

LIGHT EMITTER PACKAGES, SYSTEMS, AND METHODS

CROSS REFERENCE TO RELATED APPLICATIONS

This application is a continuation-in-part of and claims priority to both U.S. patent application Ser. No. 13/554,776 filed on Jul. 20, 2012, and U.S. Design patent application Ser. No. 29/423,422, filed May 31, 2012. This application further relates and claims priority to U.S. Provisional Patent Application Ser. Nos. 61/653,809 filed May 31, 2012, 61/665,057 filed Jun. 27, 2012, and 61/669,738 filed Jul. 10, 2012. The disclosures of these applications are incorporated by reference herein in their entireties.

TECHNICAL FIELD

The subject matter disclosed herein relates generally to light emitter packages, systems, and methods. More particularly, the subject matter disclosed herein relates to multi-chip light emitting diode (LED) packages, systems, and methods having improved performance at a lower cost.

BACKGROUND

Light emitting diodes (LEDs) or LED chips are solid state devices that convert electrical energy into light. LED chips can be utilized in light emitter packages for providing different colors and patterns of light useful in various lighting and optoelectronic applications. For example, light emitter packages can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Brighter, more efficient LED chips and/or packages can allow lighting manufacturers to use fewer LED chips to get the same brightness at a lower cost or increase brightness levels using the same LED chip count and power. Such improvements can enable delivery of improved light emitter packages and/or systems for less total cost than other solutions.

Thus, despite the availability of various light emitter packages in the marketplace, a need remains for brighter, more cost-effective light emitter packages, systems, and/or methods which consume the same and/or less power as compared to conventional packages and/or systems. Such packages, systems, and methods can also make it easier for end-users to justify switching to LED products from a return on investment or payback perspective.

SUMMARY

In accordance with this disclosure, light emitter packages, systems, and methods are provided and described herein. For example, packages, systems, and methods described herein can advantageously exhibit improved brightness, binning accuracy, light extraction, and/or ease of manufacture at a lower overall cost. In one aspect, packages, systems, and methods described herein offer cost-effective lighting solutions well suited for a variety of applications such as personal, industrial, and commercial lighting products and applications including, for example, indoor lighting, outdoor lighting, LED light bulbs, accent and track lighting, directional, low bay, high bay, roadway, parking, portable lighting, bicycle lighting, solar-powered lighting, battery-powered lighting, and high end lighting fixtures, products and/or applications. It is, therefore, an object of the present disclosure to provide light emitter packages, systems, and methods having improved performance, in one aspect, by utilizing metallic plating and/or optical conversion material disposed below portions of an optical element or lens, in addition to incorporating novel LED chips, novel chip-to-chip spacing, and/or novel placement of a reflective material, such as a solder mask within trenches of the package.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 7A to 9 are graphical illustrations of brightness and forward voltage data associated with light emitter packages and systems according to the disclosure herein.

DETAILED DESCRIPTION

Figure 1A:
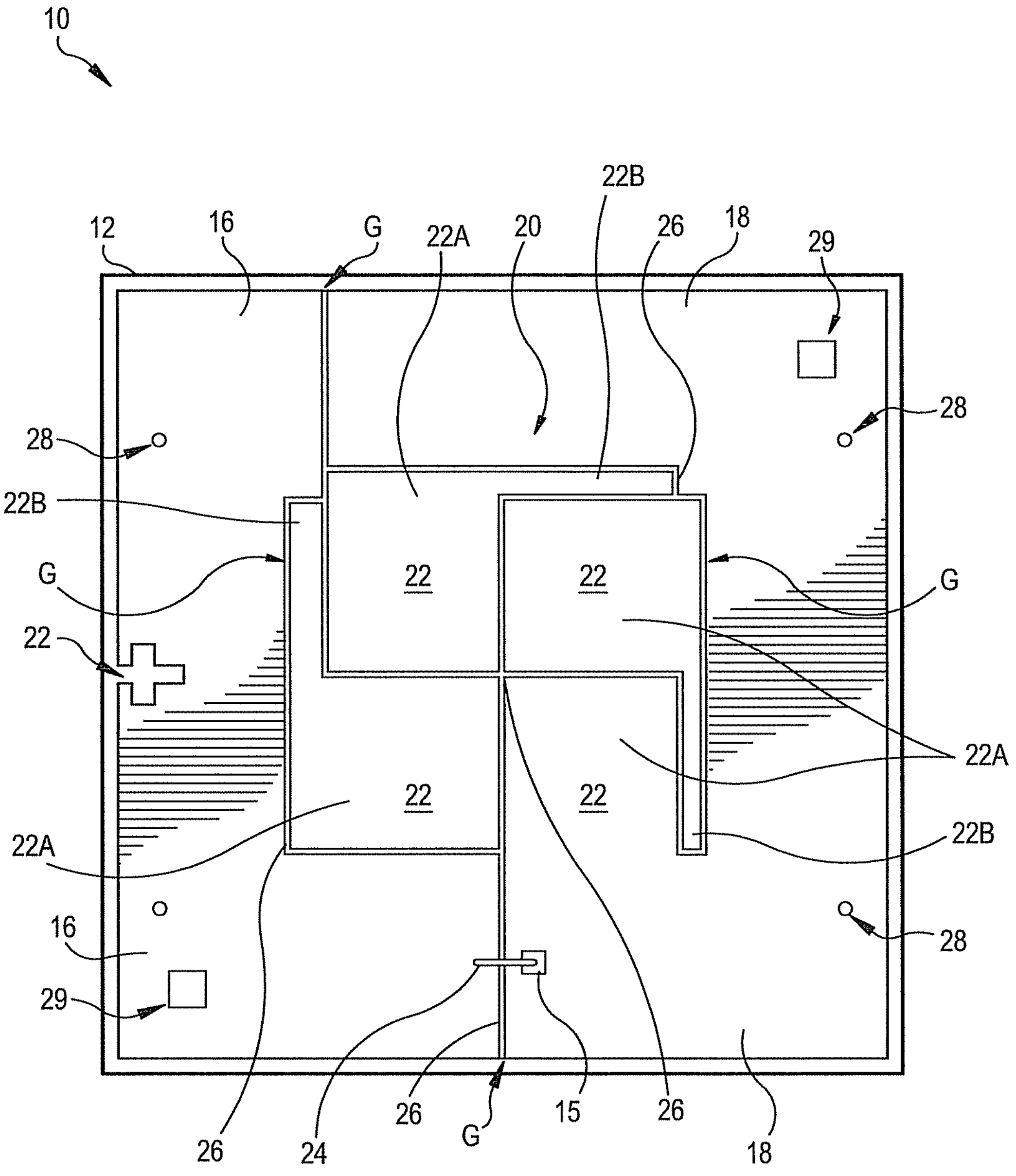
FIGS. 1A and 1B are top plan and top perspective views, respectively, illustrating a light emitter package according to one aspect of the disclosure herein.

The subject matter disclosed herein is directed to packages, systems, and methods for use with light emitters, such as light emitting diodes (LEDs). Packages, systems, and methods described herein can exhibit improved performance, for example, improved efficiency, brightness, and/or light extraction at a lower cost than conventional package and/or systems. Packages and systems described herein can utilize a plurality of novel LED chips alone and/or in combination with other novel features such as placement or configuration of exposed metallic traces, chip-to-chip spacing, and/or reflective material, such as plastic or a solder mask material In some aspects, packages, systems, and methods described herein provide a plurality of light emitters, such as LED chips, where a first LED chip directly attaches and electrically communicates to a cathode of the package and where a second LED chip wirebonds to an anode of the package.

In some aspects, string of serially connected LED chips can be disposed between the first and second LED chips passing electrical current from the cathode to the anode. This is novel and unexpected in view of conventional designs which include light emitters that are reverse biased and/or reversed in electrical polarity from LED chips disclosed herein. Wirebonds can be disposed along an outer perimeter of the plurality of LED chips to minimize any potential interference with light.

In some aspects, packages, systems, and methods described herein provide light emitters, or emitter chips, that are spaced at least apart at any distance between and/or any sub-ranges of any distance between approximately 0.010 mm and 1 mm. In some aspects, packages and systems disclosed herein can, for example and without limitation, comprise chip-to-chip spacing of between approximately 0.06 and 0.3 mm. In further aspects, packages and systems disclosed herein can comprise chip-to-chip spacing of at least approximately 0.03 mm or more, at least approximately 0.05 mm or more, at least approximately 0.06 mm or more (e.g., approximately 60 μm or more), at least approximately 0.10 mm or more, at least approximately 0.30 mm or more, at least approximately 0.50 mm or more, or more than approximately 0.625 mm. Such chip spacing can advantageously improve light extraction and/or brightness by minimizing an amount of light trapped between chips and/or blocked or absorbed by chips and/or components.

In some aspects, packages, systems, and methods disclosed herein provide exposed metal traces, where the exposed metal is not covered by any other material. The exposed metal traces can improve light reflection and can be disposed over portions of a submount disposed below the lens and outside of the lens base.

In some aspects, packages, systems, and methods disclosed herein provide trenches or gaps between one or more electrically conductive traces to which one or more light emitter chips can connect. Notably, a reflective material can be disposed within the trenches or gaps between emitter chips to improve light extraction per package. The reflective material can be white, silver, specularly reflective, diffusely reflective, a Lambertian coating, any reflective coating, plastic, or a solder mask material. The reflective material can be applied using any suitable technique, including for example, spraying, dispensing, dipping, gluing, brushing, etc.

Packages and systems described herein can exhibit improved light output, reliability, and efficacy by delivering, for example, up to and/or more than approximately 145 lumens per Watt (LPW) at 1 Watt (W) and approximately 25° C.; more than approximately 180 LPW at 1 W and approximately 25° C.; or more than approximately 200 LPW at 1 W and approximately 25° C. in selected color temperatures. Packages and systems described herein and the foregoing LPW values can be attained for emissions having at least one of a cool white (CW) color temperature, a neutral white color temperature, a warm white (WW) color temperature, and/or overlapping combinations thereof.

White emissions can have x, y color coordinates within eight or less MacAdam step ellipses of a reference point on the blackbody locus of a 1931 CIE Chromaticity Diagram. In some aspects, white emissions can have x, y color coordinates within four, or between approximately four and eight MacAdam step ellipses of a reference point on the blackbody locus of a 1931 CIE Chromaticity Diagram. In certain aspects, such a reference point on the blackbody locus may have a color temperature of less than or equal to 7000 K, less than or equal to 4000 K, less than or equal to 3500 K, or less than or equal to 3000 K. In certain aspects, combined emissions from a lighting apparatus as described herein embody at least one of (a) a color rendering index (CRI) value of at least 70 CRI, at least 75 CRI, at least 80 CRI, or at least a minimum of 85 CRI. In some aspects, the forgoing LPW values can be attached for selected color temperatures including cool white (CW) color temperatures of around 6000 K or warm white (WW) color temperatures of around 3000 K or CW colors around 5500 K. In some aspects, light emitter packages, systems, and/or methods described herein can deliver up to approximately 2050 lumens (lm) at 15 W and 25° C. in CW temperatures of around 6000 K.

Notably, light emitter packages, systems, and/or methods described herein can provide small optical lighting sources with high lumen density and excellent color consistency. In some aspects, the high lumen output and excellent chip-to-chip color consistency can be provided in a small form factor and/or small footprint with about a 7 mm×7 mm package size and a 6 mm optical source. Notably, a small footprint can provide a narrow beam for superior, improved optical control making it ideal for high lumen, directional lighting applications.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures are rotated along an axis, structure or portion described as "above", other structures or portions would be oriented "next to" or "left of the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

As used herein, the terms "specular" reflection and/or being "specularly" reflective describes a mirror-like reflection of light from a surface, in which light from a single incoming direction is reflected into a single outgoing direction.

As used herein, the terms "diffuse" reflection and/or being "diffusively" reflective describes reflection of light from a surface such that an incident ray is reflected at a plurality of angles rather than at just one angle as in the case of specular reflection.

Light emitter packages according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. Notably, the LED chips can be coated with one or more phosphors prior to die attachment within the LED package. This can improve ease of manufacture and/or cost as other portions of the package aside from the LED chips do not need to have phosphor applied, and as the phosphor can be inexpensively applied, for example, by spraying the layer on prior to die attaching LED chips within package. The layer can be optionally roughened by grinding or other mechanical or chemical roughening process to improve light extraction and reflection.

In some aspects, the phosphors can absorb a portion of light from the LED chip and emit a different wavelength of light such that the light emitter package emits a combination of light from each of the LED chip and the phosphor. In one embodiment, the light emitter package emits what is perceived as white light resulting from a combination of light emission from the LED chip and the phosphor. In one embodiment according to the present subject matter, a white emitting package can consist of an LED chip that emits light in the blue wavelength spectrum and a phosphor that absorbs some of the blue light and re-emits light in the yellow wavelength spectrum. The package can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties.

LED chips can also be coated using other methods such as electrophoretic deposition (EPD), with a suitable EPD method described in U.S. patent application Ser. No. 11/473, 089 entitled "Close Loop Electrophoretic Deposition of Semiconductor Devices", which is also incorporated herein by reference in its entirety. It is understood that light emitter packages and methods according to the present subject matter can also have multiple LED chips of different colors, one or more of which can be white emitting.

FIGS. 1A to 9 are embodiments of packages, systems, and methods for use with multiple light emitters, such as multiple LED chips. Light emitter packages and systems described herein can advantageously be configured for improved performance, such as improved brightness, by delivering more LPW at an improved, lower cost than conventional packages and systems. In general, light emitter packages and/or systems described herein can be sorted or binned both at "hot" temperatures (approximately 85° C.) or "cold" temperatures (e.g., approximately 25° C.). Packages and/or systems can be sorted or binned into groups or ranges based upon color temperature, wavelength, and/or brightness. In some aspects, a two-step binning process can be used to match the color consistency delivered by incandescent light bulbs.

Improved performance and/or novel aspects of improved light emitter packages, systems, and methods are discussed hereinbelow. Notably, novel light emitter packages disclosed herein can deliver approximately 145 LPW or more at 1 W and 25° C.; approximately 180 LPW or more at 1 W and 25° C.; and/or approximately 200 LPW or more at 1 W and 25° C. at an improved, low cost using, for example, a plurality of novel LED chips, exposed metal traces, reflective solder mask material disposed in gaps or trenches between traces, and a larger lens. In some aspects, emitter packages consisting of a plurality of LED chips can deliver more than approximately 200 LPW at 1 W and 25° C.

Figure 1B:
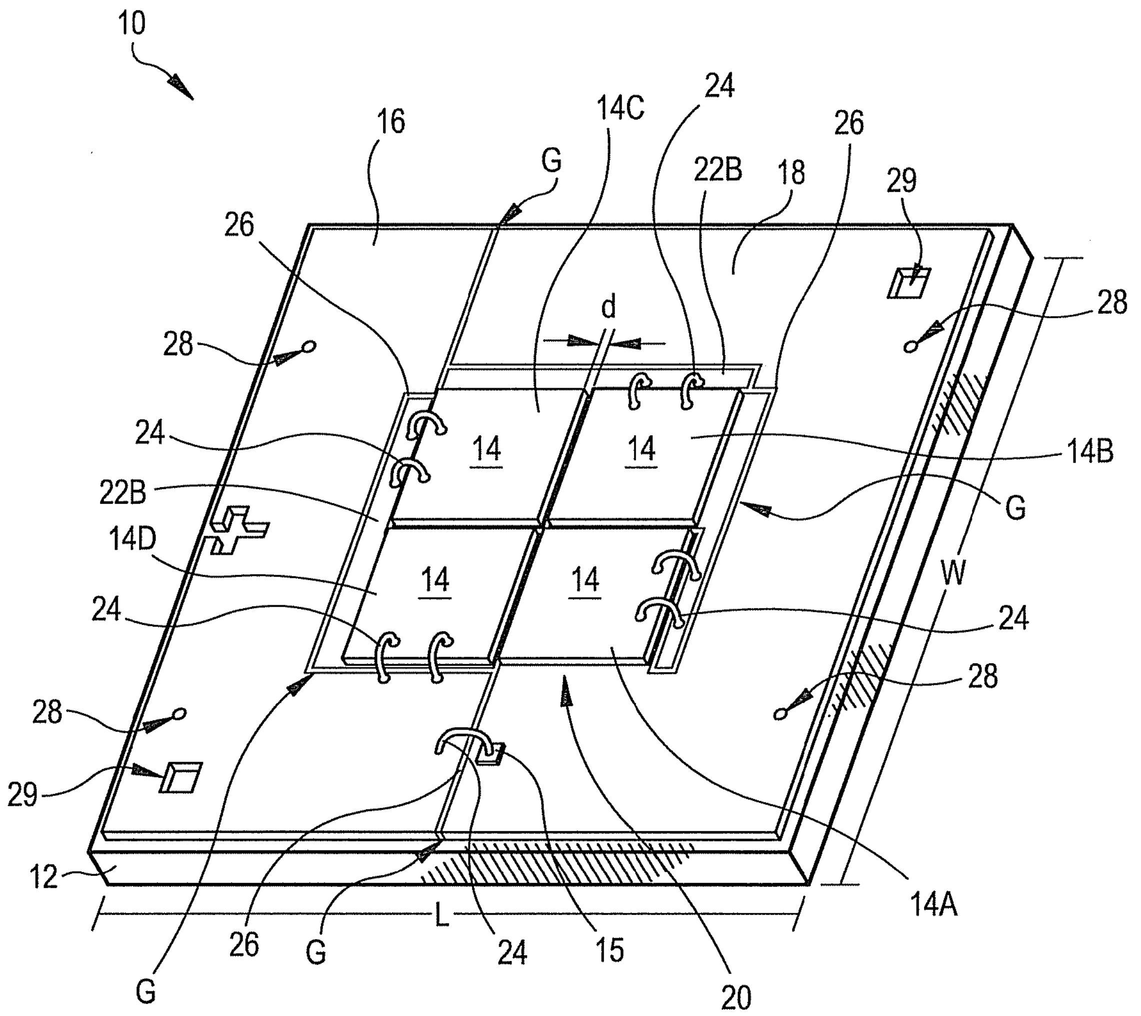

FIGS. 1A and 1B collectively illustrate embodiments of a light emitter package generally designated 10. Light emitter package 10 can comprise a substrate or submount 12 and at least one LED chip 14 disposed over attached to, and/or supported by submount 12. FIG. 1A illustrates a pattern of traces disposed over submount 12, to which a plurality of LED chips can attach. LED chips 14 are illustrated as attached in FIG. 1B.

Submount 12 can comprise any suitable material, for example, an electrical insulating (e.g. non-electrically conductive) material with a low thermal resistance and/or high thermal conductivity. Submount 12 can comprise a substrate that has been singulated from a large, continuous panel of material. In one aspect, submount 12 can comprise a non-metallic material, such as a ceramic or ceramic based material. For example, submount 12 can comprise aluminum oxide or alumina ($Al_2O_3$) and derivatives thereof, aluminum nitride (AlN) and derivatives thereof, silicon carbide (SiC) and derivatives thereof, zirconium dioxide or zirconia ($ZrO_2$) and derivatives thereof, titanium dioxide ($TiO_2$) and derivatives thereof, combinations thereof, and/or any other ceramic based or ceramic containing material.

In one aspect, AlN may be preferred as it can advantageously comprise a low thermal resistance. Material(s) having a low thermal resistance can be advantageous when provided as submount 12, as heat can more readily dissipate from each LED chip 14 and allow light emitter package 10 to run cooler at steady state, thereby increasing lumen output. In some aspects, submount 12 can comprise a continuous piece of material from the center of package 10 to the edge of package 10, and is not merely a "frame" for the package as used in conventional designs. Using a single, continuous piece of material can lower manufacturing costs as extraneous processing steps for creating the "frame" can be eliminated. In addition, extra materials such as silicone must be provided for embedding a panel into a frame, thus, such extra materials such as silicone embedded in the panel can be obviated by using the continuous, single material submount 12 described herein.

Submount 12 can comprise a material having a thermal conductivity of approximately 30 watts per meter kelvin (W/m·K) or more (e.g., zinc oxide (ZnO)). Other acceptable materials have thermal conductivities of approximately 120 W/m° K or more, (e.g., AlN which has a thermal conductivity that can range from approximately 140 to approximately 180 W/m·K). In terms of thermal resistance, some acceptable materials have a thermal resistance of approximately 2° C./W or lower. Other materials may also be used that have thermal characteristics outside the ranges discussed herein.

Submount 12 can comprise a thickness between approximately 0.25 and 1.25 millimeters (mm) as measured between uppermost and bottommost surfaces of submount 12. For example, submount 12 can comprise a thickness of approximately 0.25 to 0.5 mm; approximately 0.5 mm; approximately 0.5 to 0.75 mm; and/or approximately 0.75 to 1.25 mm. Submount 12 can comprise any suitable shape, for example, such as a square, rectangle, circular, non-circular, regular, irregular, and/or asymmetrical shape. It is further understood that submount 12 and outer perimeter of package 10 can comprise any shape, as viewed from above, including square, non-square, rectangular, circular, non-circular, asymmetrical, or other multi-sided shapes.

In one aspect, submount 12 can for example comprise a substantially square shape having a length L and a width W of approximately 5.0 mm or more. For example and without limitation, submount 12 can comprise a substantially square shape of the following length L and width W dimensions, respectively: approximately 5.0 mm×5.0 mm (e.g., an area of approximately 25 $mm^2$); approximately 6.0 mm×6.0 mm (e.g., an area of approximately 36 $mm^2$); approximately 7.0 mm×7.0 mm (e.g., an area of approximately 49 $mm^2$); approximately 9×9 mm (e.g., an area of approximately 81 $mm^2$); approximately 9.1×9.1 mm (e.g., an area of approximately 82.8 $mm^2$); and/or length(s) L and/or width(s) W of more than approximately 10 mm×10 mm. In one aspect, a submount 12 comprising an area equal to and/or greater than approximately 49 $mm^2$ (e.g., 7 mm×7 mm) package size can be used and preferred. Submounts 12 of any shape, such as rectangular or circular can also be provided.

As FIGS. 1A and 1B further illustrate, one or more areas or portions of electrically conductive material can be disposed over one or more portions of submount 12. For example, a first electrically conductive trace 16 and a second electrically conductive trace 18 can be provided and disposed over submount 12. First and second traces 16 and 18, respectively, can be physically and/or electrically separated by one or more trenches or gaps generally designated G.

In some aspects as illustrated in FIG. 1A, one or more areas or portions of electrically conductive material can also be deposited between portions of first trace 16 and second trace 18. For example and in some aspects, a plurality of traces, generally designated 20 can be disposed between first trace 16 and second trace 18. The plurality of traces 20 can comprise more than one individual trace 22 separated by one or more gaps G. In some aspects, each individual trace 22 can be adapted to attach to a portion of at least one LED chip 14 as illustrated in FIG. 1B. In some aspects, at least one individual trace 22 can extend from portions of first trace 16 and/or at least one individual trace 22 can extend from portions of second trace 18 as illustrated in FIG. 1A. Some individual traces 22 can be physically and/or electrically separated from each of first trace 16 and second trace 18 via one or more gaps G. In some aspects, each individual trace 22 and first and second traces 16 and 18, respectively, can comprise one or more layers of titanium (Ti), copper (Cu), and/or silver (Ag). In some aspects, one or more optional layers of electroless nickel immersion gold (ENIG) can also be applied over portions of traces for improving the wirebondability of light emitters, such as LED chips (FIG. 1B), to the trace layers of material.

In some aspects, first and second traces 16 and 18 can, but do not have to, be the same material or materials as the plurality of traces 20. In some aspects, first and second traces 16 and 18, respectively, and the plurality of traces 20 can be provided over submount 12 via chemical deposition, physical deposition, chemical vapor deposition, plasma deposition, electrolysis, electroplating and/or electroless plating techniques. In one aspect, any suitable processing technique can be used for coating non-metallic parts (e.g., submount 12) with electrically conductive material. In some aspects, first and second traces 16 and 18, and the plurality of traces 20, comprised of electroless metals deposited via electroless processes, may be desired as such techniques can advantageously produce traces having more uniform thicknesses as compared to other methods. Any method of layering, coating, and/or depositing conductive material over submount 12 for providing first and second traces 16 and 18, respectively, as well as the plurality of traces 20 is contemplated.

In some aspects, one or more trenches or gaps G can be disposed between adjacent individual traces 22 within the plurality of traces 20. Trenches or gaps G can be chemically or physically etched, mechanically formed via physical or mechanical removal of material, and/or otherwise formed. Any method of forming trenches or gaps G between individual traces 22 and/or first and second traces 16 and 18 is contemplated.

In some aspects, package 10 can comprise a multi-trace device adapted to receive a plurality of LED chips (14, FIG. 1B). In some aspects, gaps G can be disposed between portions of first trace 16 and the plurality of traces 20. In some aspects, gaps G can be disposed between portions of second trace 18 and the plurality of traces 20. In some aspects, first and second traces 16 and 18 can be peripherally disposed about the plurality of traces 20. That is, in some aspects the plurality of traces 20 can be centrally disposed over submount 12 and surrounded by portions of first and second traces 16 and 18.

In some aspects, the plurality of traces 20 can comprise a substantially square shaped area which is substantially centrally disposed over submount 12. In other aspects, the plurality of traces 20 can comprise a substantially circular shaped area which is substantially centrally disposed over submount 12. In some aspects, placing a plurality of LED chips (14, FIG. 1B) over the plurality of centrally disposed traces 20 can improve thermal management within package 10, as heat generated by the plurality of centrally disposed LED chips can dissipate more readily from the center to the edges of the package submount 12. In addition, heat can spread away from the center of the package 10.

As illustrated in FIG. 1A and in some aspects, some individual traces 22 can comprise a square and/or rectangular shaped portion 22A adapted to attach and/or electrically communicate with a light emitter, such as an LED chip (14, FIG. 1B). For example, at least one light emitter can be disposed over each square or rectangular shaped portion 22A and can directly attach and directly electrically communicate with the individual trace 22 via an electrically conductive paste, solder material, adhesive, flux material, or epoxy.

In some aspects, one or more leg portions 22B can extend from the rectangular or square shaped portions 22A of some individual traces 22. The leg portions 22B can be smaller in width and/or thinner than the rectangular or square shaped portions 22A of some individual traces 22. In some aspects, electrical signal or current can pass into a plurality of light emitters disposed over individual traces 22 and/or can pass between first and second traces 16 and 18, in part, by serially connecting LED chips via wirebonds 24 to adjacent leg portions 22B of individual traces 22. Each rectangular and/or square shaped portion 22A of some individual traces 22 within the plurality of traces 20 can be, but do not have to be the same size. Each rectangular and/or square shaped portion of some individual traces 22 within the plurality of traces 20 can be, but does not have to be the same shape. In some aspects, a combination of rectangular and square shaped light emitters (e.g., LED chips 14, FIG. 1B) can be used in package 10. In some aspects, only square light emitters can be used in package 10. In certain other aspects, only rectangular shaped light emitters can be used in package 10.

Rectangular and/or square shaped portions 22A of individual traces 22 can include any suitable size and can vary with respect to the size and/or shape of LED chip or chips used. For example and in some aspects, square shaped portions 22A of some individual traces 22 can have length and width dimensions that are at least approximately 300 μm×300 μm (e.g., an area of 900 $\mu m^2$ or more); at least approximately 500 μm×500 μm (e.g., an area of approximately 0.25 $mm^2$ or more); at least approximately 700 μm×700 μm (e.g., an area of approximately 0.49 $mm^2$ or more); at least approximately 1000 μm×1000 μm (e.g. 1 mm×1 mm, or an area of at least 1 $mm^2$ or more); at least approximately 1350 μm×1350 μm (e.g., 1.35 mm×1.35 mm or an area of at least 1.8 $mm^2$ or more); and/or greater than approximately 1500 μm×1500 μm (e.g., 1.5 mm×1.5 mm or an area of 2.25 $mm^2$ or more).

As noted earlier, the plurality of traces 20 can comprise a mix of square and rectangular portions of any suitable size can be provided over submount 12. In some aspects, only square or only rectangular portions of some individual traces 22 may be provided as only square or only rectangular light emitters may be provided. LED chips 14 can comprise any suitable dimension, size, and/or shape. For example, square and/or rectangle LED chips 14 having straight cut and/or bevel cut sides are contemplated herein.

In some aspects, light emitter package 10 can comprise a plurality of light emitters that are each a same size. In other aspects, light emitters of different sizes (large and small) can be used together within package 10. As such, different sizes and/or shapes of individual traces 22 within the plurality of traces 20 can be provided. In some aspects, individual traces 22 can comprise square shaped portions, rectangular shaped portions, non-square shaped portions, non-rectangular shaped portions, circular shaped portions, asymmetrically shaped portions, symmetrically shaped portions, combinations thereof, and/or any other suitably shaped and/or sized portions.

In some aspects, each LED chip 14 of the plurality of chips can be adapted to emit a same general color of light. In some aspects, LED chips 14 can be adapted to emit distinctly different colors of light. LED chips 14 can emit any one color or any combination of colors including for example, primarily green, cyan, blue, red, orange, amber, yellow and/or white light emitters can be provided. In one aspect, LED chips 14 can comprise similar and/or different targeted wavelength bins including red, blue, green, amber, red-orange, and/or combinations thereof.

Referring to FIG. 1B, a plurality of LED chips 14 can be provided over the plurality of traces 20. In some aspects, each LED chip 14 can be entirely disposed over a portion of one individual trace 22 without traversing and/or being disposed over any portion of any gap G. That is, LED chips 14 can electrically communicate with at least two traces, including one of first trace 16, second trace 18, and/or one of the plurality of traces 22 via a combination of direct die attach and electrical connectors, such as wirebonds 24. In some aspects, each LED chip 14 can comprise a vertically structured chip having an electrical terminal on a bottom surface of the chip for directly attaching and electrically communicating with the underlying trace. Each LED chip 14 can also comprise one or more electrical terminals on an opposing upper surface of the chip for electrically communicating to a portion of another trace via wirebonds 24. For example, as shown, each LED chip 14 can comprise two bond pads disposed on the upper surface of the chip for wirebonding to traces via wirebonds 24. In some aspects, LED chips 14 can be vertically structured such that the electrical terminal disposed on the bottom of the LED chip is a different electrical polarity than the bond pads. In some aspects, each bond pad on the upper surface of each LED chip 14 can be the same electrical polarity.

As FIG. 1B illustrates, a first LED chip 14A can be disposed over at least one individual trace 22 that can extend from a portion of second trace 18. First LED chip 14A can electrically communicate with another individual trace, for example, an adjacent leg portion 22B of an adjacent individual traced 22, via wirebonds 24. Electrical signal can then pass into a second, serially connected LED chip 14B via square or rectangular portion 22A of the adjacent individual trace 22. Second, third, and fourth LED chips 14B, 14C, and 14D, respectively, can be disposed over second, third, and fourth individual traces 22. Each of the LED chips 14 can be serially connected within package 10. Fourth LED chip 14D can be disposed adjacent to first LED chip 14A, and can be wirebonded to a portion of first trace 16. At least two, four, or more than four LED chips 14 can be provided within package 10.

In one aspect, first and second electrical traces 16 and 18, respectively, can comprise an anode and cathode pair configured to pass electrical current or signal into the plurality of LED chips 14. For example, electrical current can be conducted through and/or within submount 12 from an outside electrical power source (not shown) into one or more electrical contacts (e.g., 38, 40, FIG. 3) and respective traces 16 and 18 by electrically conductive "through-holes" or "vias" 28 which provide a conduit for electrical current within light emitter package 10. The electrical current can then flow or pass between first and second traces 16 and 18 and into a plurality of serially connected LED chips 14 thereby causing illumination of each LED chip 14. Electrical current can then exit light emitter package via at least one electrical contact (e.g., 38 or 40, FIG. 3).

In one aspect, first electrical trace 16 can comprise an anode as denoted by the "+" shaped indicator symbol or sign and second electrical trace 18 can comprise a cathode. Notably, each LED chip 14 can comprise a novel chip structure and electrical configuration, as LED chips 14 can be serially connected between one LED chip directly attach to a cathode, e.g., second trace 18, and one LED chip wirebonded to an anode, e.g., first trace 16. That is, LED chips 14 within package 10 can be reverse biased and/or opposite in electrical polarity from typical LED chips.

Provision of LED chips 14 wirebonded to a portion of an anode and mounted to a portion of a cathode is unexpected in view of conventional wisdom, and in fact, is the opposite electrical configuration from conventional LED chips (e.g., conventional chips are typically mounted over the cathode and wirebonded to the anode). In one aspect, LED chips 14 described herein are available from Cree, Inc., of Durham, N.C., the assignee of the present subject matter, the LED chip structures, features, and associated methods of which are set forth in, for example, U.S. patent application Ser. No. 13/168,689, filed Jun. 24, 2011, and entitled "LED Structure With Enhanced Mirror Reflectivity", the entire disclosure of which is incorporated herein by reference.

Notably, wirebonds 24 extending form each LED chip 14 can be positioned towards an outer periphery of the plurality of chips, or extend towards an outer edge of submount 12. This can further improve light extraction, as wirebonds 24 are not disposed towards a center of the plurality of LED chips 14 where they could block, absorb, or otherwise interfere with light. Wirebonds 24 can comprise any electrically conducive material, such as, for example and without limitation, gold (Au) or an alloy containing Au. Wirebonds 24 can also include Al, Sn, or Ag. As noted above, a first novel LED chip 14A can be mounted, either directly or indirectly, over a portion of the cathode, for example, a portion of second electrical trace 18 via a silicone material or epoxy, a metal epoxy (e.g., Ag epoxy), a solder, solder paste (e.g., AuSn or SnAg solder paste), a flux material, a eutectic material, combinations thereof, and/or any other suitable adhesive material. A second novel LED chip (e.g., 14D) can be wirebonded to an anode.

The plurality of LED chips 14 can comprise chips that are uniformly spaced apart from each other, chips that are non-uniformly spaced apart from each other, or combinations thereof. That is, some LED chips 14 can be spaced close to some LED chips and farther away from some other chips. In some aspects, each edge of each LED chip 14 can be equidistant to adjacent chip(s). In some aspects, chips can be spaced apart by at least a distance d. In some aspects, distance d can correlate to an improved brightness of package 10. That is, distance d can be optimized for maximum, improved brightness, such that light does not become trapped within gaps G and/or become blocked or absorbed by adjacent chips or components within package 10.

In some aspects, adjacent LED chips 14 can be spaced close to gaps G, but not traverse across a portion of any gap G. In some aspects, distance d can be slightly larger than a width of one or more gaps G. In some aspects, distance d can be approximately 0.03 mm or more; approximately 0.05 mm or more; approximately 0.06 mm or more (e.g., approximately 60 μm or more); approximately 0.10 mm or more; approximately 0.30 mm or more; approximately 0.50 mm or more; or more than approximately 0.625 mm. In some aspects, distance d can be between approximately 0.06 mm and 0.3 mm, however, distances of more than 0.3 can be provided.

Notably, packages disclosed herein can for example average more than approximately 100 LPW at 1 W and 25° C., such as approximately 145 LPW at 1 W and 25° C. in selected color temperatures between approximately 2700 K and 7000 K and/or between approximately 2700 K and 5000 K. In some aspects, packages disclosed herein can average more than approximately 180 LPW at 1 W and 25° C. As these numbers are averages, and as discussed further below, packages disclosed herein can deliver approximately 200 LPW or more at 1 W and 25° C. LED chips 14 can be spaced apart at any distance d between and/or any sub-ranges of a distance d between approximately 0.010 mm and 1 mm, such as any distance approximately equal to or greater than 0.06 mm.

One or more electrostatic discharge (ESD) protection devices 15 can optionally be disposed within package 10 and can be electrically connected to first and second 16 and 18 via wirebond 24 and reverse biased with respect to the plurality of serially connected LED chips 14. Where used, ESD device 15 can protect against damage from ESD within package 10. For example, the arrangement of LED chips 14 and ESD device 15 can allow excessive voltage and/or current passing through package 10 from an ESD event to pass into and/or through ESD device 15 instead of LED chips 14, thereby protecting LED chips 14 from damage. ESD device 15 can comprise any suitable body or member configured to protect package 10 from an ESD event. For example, ESD device 15 can comprise a vertical silicon (Si) Zener diode, a differently dimensioned and/or smaller LED chip arranged reverse biased to LED chips 14, a surface mount varistor, and/or a lateral Si diode. As illustrated, ESD device 15 can comprise a vertically structured device having one electrical contact on the bottom and another electrical contact on the top; however, a horizontally structured ESD device 15 can also be provided.

Notably, first and second traces 16 and 18 can comprise layers of exposed metal for improving reflection and/or light extraction from package 10. In some aspects, each individual trace 22 of the plurality of traces 20 can comprise layers of exposed metal. In one aspect, first and second traces 16 and 18 as well as the plurality of traces 20 comprised of exposed metal can advantageously reflect more light than underlying submount 12, which can improve brightness, light extraction, and performance from light emitter package 10. Notably, leaving metallic traces exposed (e.g., uncovered, such as without a reflective material, a solder mask, or any other masking material) can also decrease processing steps and/or materials consumed during manufacture, which results in a lower cost. In some aspects, first and second traces 16 and 18 and the plurality of traces 20 can comprise metallic reflectors which are specularly reflective. As described below, gaps G disposed between adjacent traces (e.g., 16, 18, and 22) can be at least partially filled with a diffusively reflective material 26 to further improve light extraction. Reflective material 26 can be applied using any technique, such as dispensing in gaps G.

In one aspect, first and second traces 16 and 18 and the plurality of traces 20 can each comprise a Cu layer, either directly or indirectly disposed over submount 12. The Cu layer can comprise a thickness ranging for example from approximately 20 μm to approximately 100 μm, and/or any sub-range therebetween, such as approximately 20 to 50 μm; approximately 50 to 55 μm; approximately 55 to 65 μm; approximately 65 to 75 μm; approximately 75 to 85 μm; and/or approximately 85 to 100 μm. In one aspect, the Cu layer can for example comprise an overall average thickness of approximately 70 μm. First and second traces 16 and 18, respectively and the plurality of traces 20 can further comprise an optional, initial layer of Ti that can be deposited directly over submount 12 prior to deposition of the Cu layer. Where used, the Ti layer can comprise a thickness ranging from approximately 0.01 to 1 μm, and/or any sub-range or thickness therebetween, such as approximately 0.01 to 0.05 μm; 0.05 to 0.1 μm; and/or 0.1 to 1 μm. In one aspect, the Ti layer can comprise a thickness or overall thickness of approximately 0.1 μm. First and second traces 16 and 18, respectively and the plurality of traces 20 can further comprise an optional layer of Ag that can be deposited, or otherwise formed, directly over the Cu layer such that the Cu layer is disposed between the Ti and Ag layers. Where used, the Ag layer can comprise a thickness from approximately 0.1 to 1 μm, and/or any sub-range therebetween, such as approximately 0.1 to 0.2 μm; 0.2 to 0.5 μm; 0.5 to 0.8; and/or 0.8 to 1 μm.

Referring to FIGS. 1A and 1B in general and as noted above, light emitter package 10 can further comprise at least one trench or gap G disposed between the anode and cathode, such as between first and second traces 16 and 18, respectively. A plurality or network of gaps G can also be disposed between first trace 16, second trace 18, and individual traces 22 within the plurality of traces 20. Gaps G can physically and electrically separate portions of first and second traces 16 and 18, respectively, portion of first trace and individual traces 16 and 22, respectively, and/or portions of second trace and individual traces 18 and 22, respectively.

Gaps G can be formed using any suitable technique. In one aspect, gaps G can be at least partially etched after deposition or application of material forming first and second traces 16 and 18 and the plurality of traces 20. That is, first and second traces 16 and 18 and/or each of the plurality of traces 20 can initially comprise a uniform area or portion of conductive material comprised of one or more layers of metallic material. The layers of metallic material can subsequently become at least partially etched, thereby separating first trace 16 from second trace 18 and individual traces 22 from the plurality of traces 20 via gaps G. In further aspects, gap G can comprise an area of submount 12 that was masked with photoresist prior to sputtering conductive material over submount 12 to provide first and second traces 16 and 18 and the plurality of traces 20.

Notably, a reflective material 26 can be positioned in, disposed in, and/or otherwise configured to fill the space within gap G, such that reflective material 26 is disposed between portions of first and second traces 16 and 18, respectively. In some aspects, reflective material 26 can be disposed between opposing side walls of first and second traces 16 and 18. Reflective material 26 can also be disposed between portions of first trace 16 and at least one trace of the plurality of traces 20 and between second trace 18 and at least one trace of the plurality of traces 20. Each individual trace 22 of the plurality of traces can be separated by a trench or gap G which can be at least partially filled with reflective material 26.

In one aspect, reflective material 26 disposed within gaps G can comprise a white material, a silver material, a plastic material, a Lambertian coating, a dispensable material, any reflective coating, and/or a mask material, such as a solder mask. In some aspects, reflective material 26 can comprise a white or silver-white liquid curable solder mask. Reflective material 26 can advantageously fill gap G thereby reducing the amount of light that may become trapped and/or absorbed by gap G, which can improve the brightness and overall optical performance of emitter package 10. In one aspect, reflective material 26 can be applied only within gap G and not over portions of any traces (e.g., including first trace 16, second trace 18, and/or any trace of the plurality of traces 20) such that the amount of solder mask material used per package can be reduced or minimized, which can advantageously lower the cost of light emitter package 10.

As noted above, first and second traces 16 and 18 can comprise an anode and cathode, respectively, which can be disposed over first and second portions of submount 12. Reflective material 26 can in one aspect be disposed over a third portion of submount 12, where the third portion of submount 12 can optionally be disposed between the first and second portions of submount 12, such as between opposing first and second traces 16 and 18, respectively. In one aspect, reflective material 26 can only be disposed within gaps G, such that first and second traces 16 and 18, respectively and the plurality of traces 20 comprise areas of exposed metal disposed directly below and/or outside portions of a lens (e.g. 32, FIG. 2). In some aspects, reflective material 26 can be disposed between adjacent LED chips 14. This novel placement of reflective material between chips, when combined with the exposed metal traces, chip spacing, and/or novel LED chip 14 configuration, (e.g., LED chips mounted to a cathode and wirebonded to an anode), improves reflection, light emission, brightness, and overall performance of light emitter package 10.

Still referring to FIGS. 1A and 1B in general, light emitter component 10 can further comprise one or more through-holes filled with electrically conductive material, or electrically conductive vias 28. Electrically conductive vias 28 can extend internally through and/or within submount 12 between a first bottom contact (e.g., 38 FIG. 4) and first trace 16 and between a second bottom contact (e.g., 40, FIG. 4) and second trace 18. Light emitter package 10 can further comprise one or more alignment areas 29 or fiducials that can be used to help with registration and/or alignment of light emitter package 10 during fabrication and processing.

Notably, light emitter package 10 can exhibit improved light output, reliability, and efficacy by delivering, for example, up to and/or more than approximately 200 LPW at 1 W and approximately 25° C. in selected color temperatures, for example, CW color temperatures around 6000 K, WW color temperatures around 3000 K, or any temperature therebetween. Package 10 and/or systems incorporating package 10 can advantageously deliver more LPW at a lower cost than other existing packages or systems. Packages 10 can also advantageously use multiple light emitters, or multiple LED chips as opposed to a single chip. This can increase efficiency of package 10, as multiple chips can be manufactured less expensively than single, high brightness and large chips. Thus, multiple chips can advantageously lower manufacturing costs and increase efficiency. The multiple chips disposed centrally within package 10 can also advantageously comprise a small optical source with a high lumen density, thus improving optical control and color consistency. Optical control can be important, for example, in outdoor directional lighting applications where control is needed to more efficiently utilize light by illuminating only where needed. Shining light in places that are not needed can be wasteful and inefficient.

Novel features of the plurality of LED chips 14 (e.g., at least one LED chip mounting to a cathode and at least one other LED chip wirebonding to an anode), when combined with exposed or uncovered metallic traces, improved chip spacing, and/or placement of reflective material, such as solder mask, within a portion of trenches or gaps G is shown to improve package 10 brightness and efficiency. In one aspect, LED chips 14 can comprise alternating p-GaN and n-GaN layers which, in part, advantageously allow for one or more smaller barrier layers to be provided adjacent one or more highly reflective mirrors. In one aspect, the one or more barrier layers can be smaller in width than the mirror layers. Notably, this can advantageously allow for increased light extraction and/or brightness per LED chip 14, as decreasing the size of the barrier layer(s) can allow for barrier layer(s) that is/are minimally exposed and/or not exposed, thereby reducing the dimming effects of the barrier layer(s). Thus, packages 10 comprising LED chips 14 can be configured to deliver more LPW per package, for example, approximately 145 LPW or more at 1 W and 25° C., approximately 180 LPW or more at 1 W and 25° C., and/or approximately 200 LPW or more at 1 W and approximately 25° C.

LED chips 14 described herein are available from Cree, Inc., of Durham, N.C., the assignee of the present subject matter, the LED chip structures, features, and associated methods of which are set forth in, for example, U.S. patent application Ser. No. 13/168,689, filed Jun. 24, 2011 which has previously been incorporated herein by reference.

Figure 2:
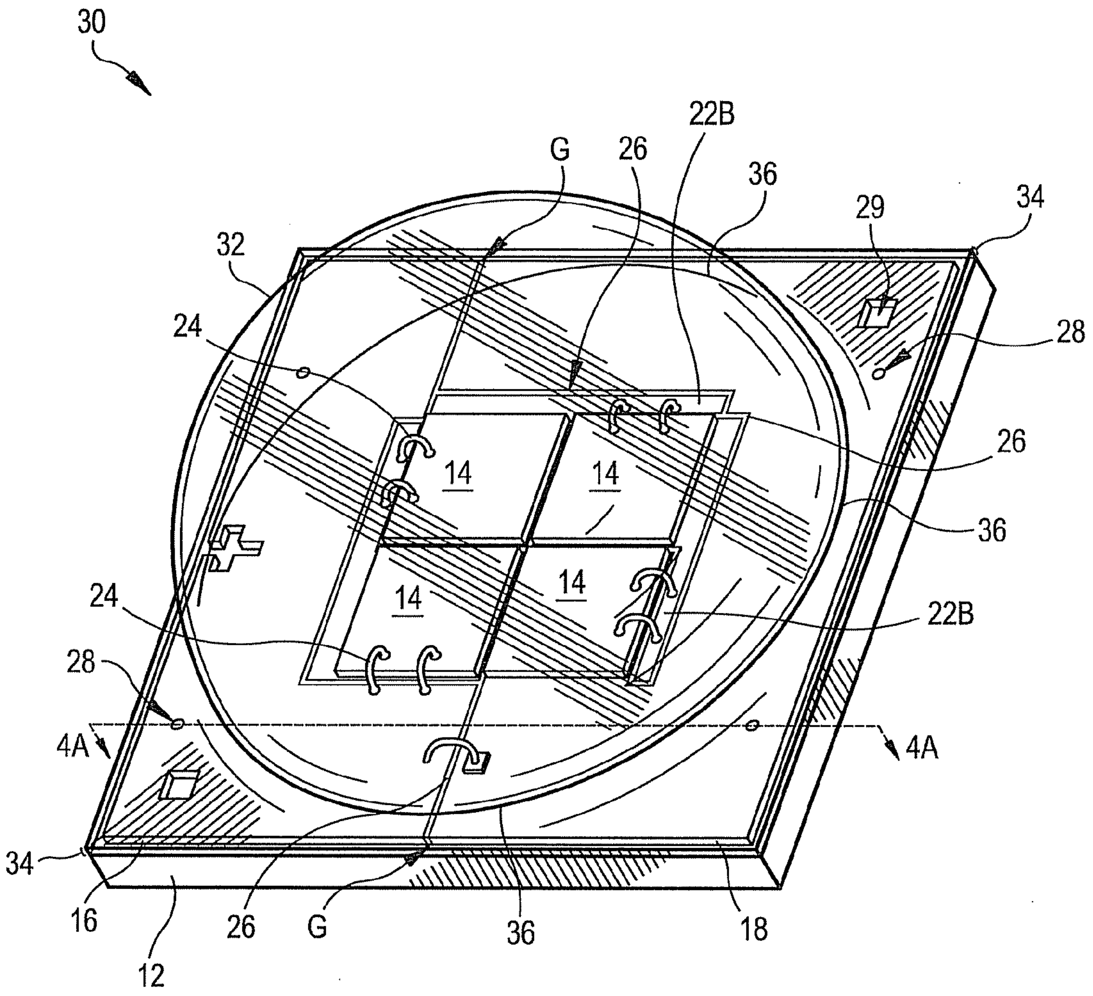
FIG. 2 is a top perspective view illustrating a light emitter package according to another aspect of the disclosure herein.

FIG. 2 illustrates a second embodiment of a light emitter package, generally designated 30. Light emitter package 30 is similar in form and function to package 10; however, light emitter package 30 can further comprise an optical element. An optical element can comprise any member or material configured to produce light output of a desired shape and/or position light in a desired direction, and can comprise a layer of encapsulant and/or a lens 32. A protective layer 34 can extend from portions of lens 32, for example, outwardly from portions of a lens base 36, and can be configured to extend over submount 12, and up to outermost edges of submount 12.

In some aspects, at least a portion of lens 32 can be disposed over portions of first and second traces 16 and 18, respectively, and the plurality of traces 20, each of which can comprise areas of exposed metal. Optical element or lens 32 can be formed on a top surface of submount 12 and can be centrally disposed or centrally aligned over a center of the plurality of LED chips 14 and/or a center of submount 12, such that an apex, or area of maximum height, can be aligned over the center of the plurality of LED chips 14 (see e.g., FIG. 4) and/or the center of submount 12. In other aspects, lens 32 can be non-centrally disposed (e.g., off-center) with respect to the center of the plurality of LED chips 14 and/or the center of submount 12. Lens 32 can provide both environmental and/or mechanical protection of package components, such as LED chips 14, wirebonds 24, and/or exposed metallic traces, such as first and second traces 16 and 18 and each of the plurality of traces 20. In some aspects, package can include an overall maximum height from the electrical contacts to the apex of lens 32. The overall height can be approximately 3 mm or more, approximately 3.5 mm or more, approximately 4 mm or more, or greater than approximately 4 mm.

In some aspects, lens 32 can comprise any material, such as an epoxy, plastic, glass, and/or silicone material, and can be provided using any method, such as encapsulating or molding. Lens 32 can comprise an overmolded lens, and comprise any suitable shape depending on the desired shape of the light output. One suitable shape as shown is hemispheric, where lens 32 comprises a substantially circular lens base 36. Notably, portions of first and second traces 16 and 18, respectively, each of which can comprise areas of exposed metal, can at least partially and/or substantially be disposed over a portion of submount 12 that is outside of lens base 36. Thus, the exposed metallic traces can advantageously reflect light by covering a large portion of submount 12 and can extend over substantial portions of submount 12 that are under or below lens 32 and lens base 36 as well as substantial portions of submount 12 that are outside of lens base 36 (e.g., towards corners, below protective layer 34). First and second traces 16 and 18 and/or the plurality of traces 20 can, but do not have to extend to the outermost edges of submount 12. For example, as shown, first and second traces 16 and 18 do not extend to all the way flush with the outermost edges of submount 12.

A lens having a non-hemispheric or circular cross-sectional and/or base shape is also contemplated herein, such as an ellipsoid bullet shaped lens, flat lens, hex-shaped lens and/or lens base, and/or square shaped lens and/or lens base. In one aspect, lens 32 can comprise a silicone material that is suitable for molding and can provide suitable optical transmission properties. It can also withstand subsequent reflow processes and does not significantly degrade over time. It is understood that lens 32 can also at least partially be textured to improve light extraction and/or be coated with or contain optical conversion, light scattering, and/or reflective materials such as phosphors or light scattering particles.

As noted above, protective layer 34 can substantially cover the top surface of submount 12 and extend between edges of lens base 36 and one or more edges of submount 12. Protective layer 34 can provide additional protection for components of light emitter package 30, such as LED chips 14, traces (e.g., 16, 18, and 20) reflective material 26 and/or wirebonds 24. Protective layer 34 can further reduce damage and/or contamination such as grease or debris during subsequent processing steps and use. For example, protective layer 34 can protect first and second traces 16 and 18 and/or ESD protection device 15 from peeling and/or lifting during processing. Protective layer 34 can be formed during formation of lens 32 and can comprise the same or different material as lens 32. It is understood, however, that package 30 can also be provided without protective layer 34. It is understood that the lens arrangement of light emitter package 30 can easily be adapted for use with a secondary lens or optics that can be included over lens 32 by the end user to facilitate beam shaping. These secondary lenses are generally known in the art, with many of them being commercially available.

Protective layer 34 can optionally comprise one or more markings (not shown), for example, notches and/or ridges associated with the mold block and/or molding process. For example and in one aspect, optional channels can be formed or disposed in the mold block which forms lens 32 and protective layer 34. Such channels can reduce and/or prevent air bubbles from occurring in the lens encapsulant during the molding process, and can also prevent under filling. Channels can cause markings (e.g., notches or ridges, not shown) over or on portions of protective layer 34, and can further ensure that a cover film (not shown) used during the molding process sits into the lens cavity properly. Channels can advantageously create an easier path for air under the film to escape. The film cover can be used to cover the mold block to reduce or prevent silicone from settling into the mold. However, if all the air is not removed from between the film cover and mold block, an under filled lens will be observed. The channels can increase the airflow under the film and allow all the air to flow out before the film was sealed to the frame. Thus, optional channels in the mold block can advantageously prevent and/or reduce observed under filling, but may leave remnant type markings (not shown) over portions of lens 32 and/or protective layer 34.

Figure 3:
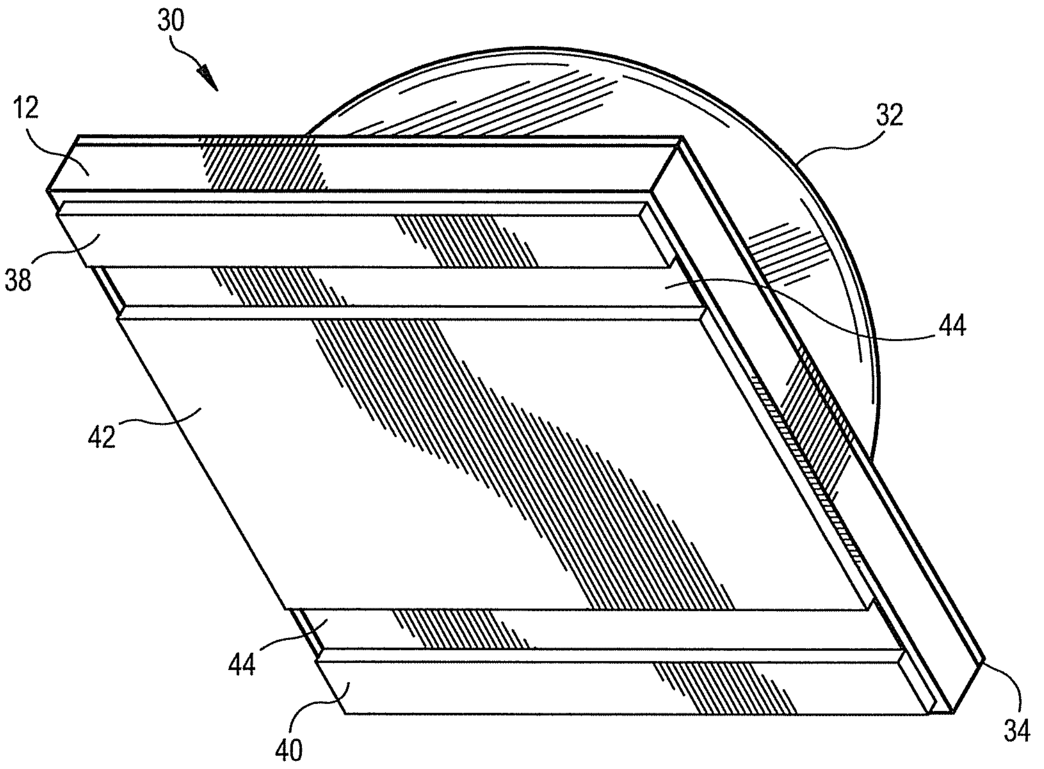
FIG. 3 is a bottom perspective view illustrating a light emitter package according to the disclosure herein.

FIG. 3 is a bottom perspective view of light emitter package 30. Package 30 can comprise first and second electrical contacts 38 and 40 adapted to pass electrical signal or current into first and second traces 16 and 18, respectively, causing illumination of LED chips 14 (FIG. 2). First and second electrical contacts 38 and 40 can comprise metallized areas for receiving electrical signal from an external source (not shown), for example, an electrical circuit, a PCB, a metal core printed circuit board (MCPCB), a circuit of a lighting system, a flex circuit, a heat sink, combinations thereof, and/or any other source adapted to transfer electrical current.

In some aspects, first and second electrical contacts 38 and 40 can for example comprise at least one layer of Cu, and optional layers of Ti and/or Ag. The at least one layer of Cu can comprise a thickness ranging from approximately 50 μm to approximately 100 μm, and/or any sub-range therebetween, such as approximately 50 to 55 μm; 55 to 65 μm; approximately 65 to 75 μm; approximately 75 to 85 μm; and/or approximately 85 to 100 μm. In one aspect, the Cu layer can comprise an overall average thickness of approximately 70 μm. Where used, the optional Ti layer of contacts 38 and 40 can be disposed between the submount 12 and Cu layer, and can comprise a thickness ranging from approximately 0.01 to 1 μm, and/or any sub-range or thickness therebetween, such as approximately 0.01 to 0.05 μm; 0.05 to 0.1 μm; and/or 0.1 to 1 μm. In one aspect, the Ti layer can comprise a thickness or overall thickness of approximately 0.1 μm.

First and second contacts 38 and 40, respectively, can further comprise an optional layer of Ag that can be deposited, or otherwise formed, directly over the Cu layer such that the Cu layer is disposed between the Ti and Ag layers. Where used, the Ag layer can comprise for example a thickness from approximately 0.1 to 1 μm, and/or any sub-range therebetween, such as approximately 0.1 to 0.2 μm; 0.2 to 0.5 μm; 0.5 to 0.8; and/or 0.8 to 1 μm.

First and second electrical contacts 38 and 40 can be disposed on a surface of submount 12 that is opposite of placement of first and second traces 16 and 18, the plurality of traces 20, and/or the plurality of LED chips 14. For example, first and second electrical contacts 38 and 40 can be disposed on a bottom surface of submount 12 and first and second electrical traces can be disposed on the top surface of submount 12. Electrically conductive vias 28 (FIGS. 1, 2, and 4) can be disposed between portions of and/or electrically connect first and second electrical contacts 38 and 40 to first and second traces 16 and 18, respectively. Electrical current can then pass between first and second contacts 38 and 40 to first and second traces 16 and 18, respectively, for illumination of the serially connected LED chips 14 (FIG. 2) when electrical energy is converted into light.

A current or electrical signal can be applied through first and second electrical contacts 38 and 40 from an external source (not shown) when package 30 mounts over external source. For example, first and second electrical contacts 38 and 40 can electrically communicate to solder contacts or other conductive paths located on the external source (not shown), and pass current into first and second traces 16 and 18, respectively. An external source can comprise any suitable external source capable of conveying or passing electrical current into package 30. In the embodiment shown, light emitter package 30 can be arranged for mounting using surface mount technology and device 30 can comprises internal conductive paths defined by one or more conductive vias 28 (also shown in FIGS. 4A and 4B). First and second electrical contacts 38 and 40 can at least partially align with first and second electrical traces 16 and 18, respectfully.

Figure 4:
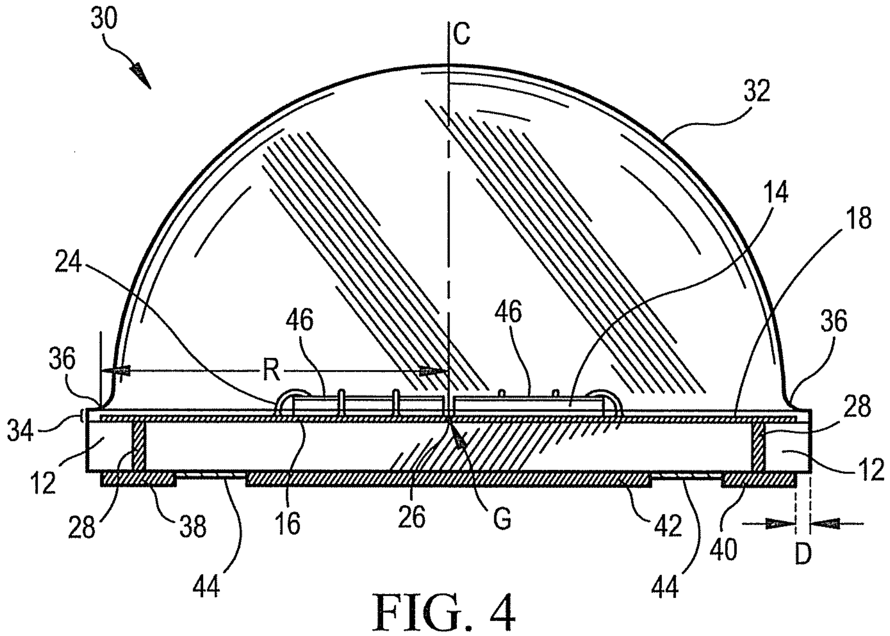
FIG. 4 is a cross-sectional view illustrating light emitter packages according to the disclosure herein.

Still referring to FIG. 3, emitter package 30 can further comprise a thermal element 42 disposed over the bottom surface of submount 12. Thermal element 42 can optionally be disposed between first and second electrical contacts 38 and 40, respectively. In one aspect, thermal element 42 can be disposed in a central location of submount 12 below the one or more of the plurality of LED chips 14 (FIGS. 2 and 4). Thermal element 42 can comprise any thermally conductive material and can be in at least partial vertical alignment with LED chips 14 (FIGS. 2 and 4). In one embodiment, thermal element 42 can be electrically separated from electrical traces 16 and 18 on top surface of submount 12 as well as first and second contacts 38 and 40 bottom surface of submount 12. Although heat from LED chips 14 can laterally spread over the top surface of submount 12 via traces (e.g., first and second traces 16 and 18 and plurality of traces 20, FIG. 2), more heat can pass into submount 12 directly below and around the plurality of LED chips 14. Thus, thermal element 42 can assist with heat dissipation by allowing heat to spread into thermal element 42 where it can dissipate more readily from the package 30.

For packages or device used in surface mount technology, the thickness of thermal element 42 and first and second electrical contacts 38 and 40 can be approximately the same such that all three make contact to a lateral surface such as a PCB. To improve wetting of the solder however, and to ensure a more robust contact between thermal element 42 and an external heat sink, thermal element 42 may extend away from the body of the package 30 to a greater distance than first and second electrical contacts 38 and 40. That is, it is contemplated that thermal element 42 can be thicker than first and second electrical contacts 38 and 40.

Notably, areas or portions of electrically and/or thermally insulating material, such as areas of solder mask material 44, can be provided between thermal element 42 and each of first and second electrical contacts 38 and 40. In one aspect, solder mask 44 can comprise a green color, and can be approximately 1 to 25 μm thick, and any sub range thereof, such as approximately 1 to 5 μm; approximately 5 to 10 μm; approximately 10 to 13 μm; approximately 13 to 15 μm; approximately 15 to 20 μm; and/or approximately 20 to 25 μm.

Referring now to FIG. 4, a sectional view of light emitter package 30 can be seen. For example, the sectional view can be disposed along line 4A-4A of FIG. 2. As FIG. 4 illustrates, one or more conductive vias 28 can extend through submount 12 between first electrical contact 38 and first electrical trace 16 for passing electrical signal therebetween. Similarly, one or more conductive vias 28 can be formed extending between second electrical contact 40 and second trace 18 such that when an electrical signal is applied to second contact 40 it can be conducted through submount 12 and into second trace 18 and into a first LED chip, and passed into the other serially connected LED chips. Conductive vias 28 can comprise any suitably electrically conducting material, such as Ag, Cu, Au, Pt, or any other metal or metal alloy and can be applied using any suitable technique. As conductive vias 28 physically and/or electrically connect respective electrical contacts (e.g., 38 and 40) and respective traces (e.g., 16 and 18), it is understood that electrical contacts and/or traces may be positioned in other arrangements, including adjacent or lateral arrangements, in addition to the arrangement illustrated.

Conductive vias 28 can form between electrical contacts (e.g., 38 and 40) and respective traces (e.g., 16 and 18) and can be substantially vertically and/or non-vertically arranged. For example, in some aspects conductive vias 28 can be arranged at an angle within submount 12. It is also understood that instead of vias 28, one or more intervening metallic or conductive layers and/or contacts can be provided between one or more surfaces of the submount 12 between electrical contacts (e.g., 38 and 40) and respective traces (e.g., 16 and 18), even, for example, along external lateral surfaces of submount 12.

As FIG. 4 further illustrates, reflective material 26 (shown in black for clarity purposes) can be at least partially disposed within gap G between portions of first trace 16 and second trace 18. First and second traces 16 and 18 can comprise areas of exposed metal, such as exposed Cu, Ti, Ag, and/or ENIG materials or layers as previously described. First and second traces 16 and 18 can generally occupy a large surface area of submount 12 and can be disposed about a plurality of traces 20. Each trace of the plurality of traces 20 can be separated by a trench or gap G. Reflective material 26 can be disposed in each trench or gap G. In some aspects, first and second traces 16 and 18, as well as the plurality of traces 20, can cover the substantial majority of the area between the outermost edges of submount 12. Each trace can comprise areas of exposed metal which can extend across the majority of submount 12, including areas outside of lens base 36. By extending traces in this manner, the amount of heat which can be dissipated or spread away from LED chips 14 can be improved. Thermal dissipation of heat generated in LED chips 14 can thus be improved, which improves the operating life and reliability of package 30. Improved thermal properties can also allow for a higher operating power of LED chips 14 and light emitter package 30.

Lens 32 of light emission package 30 can comprise a lens base 36 having a radius R which extends from approximately the centerline C of lens 32 to an edge defined by lens base 36, or where lens base 36 intersects with protective layer 34. In one aspect, the centerline C of lens 32 can correspond to the centerline of package 30 and/or the centerline of the plurality of LED chips 14, however, centerline C of lens 32 can also be off-center with respect to either the centerline of package 30 or the centerline of LED chips 14. Lens 32 can comprise a wide viewing angle, such as approximately 120° or more, such as approximately 125°.

In one aspect, lens can 32 comprise a substantially circular shaped lens base 36 disposed over a substantially square shaped submount 12 such that a diameter of lens 32 (e.g., 2×R) can be similar to length L and/or width W of submount 12. Lens base 36 can comprise radius R of approximately 1 to 8 mm (e.g., and a lens base area of approximately 3 $mm^2$ to 113 $mm^2$) and/or any number or sub-range thereof. For example, lens base 36 can comprise radius R that is approximately equal to or greater than 1 mm; approximately equal to or greater than 2 mm; approximately equal to or greater than approximately 3 mm; approximately equal to or greater than approximately 3.25 mm; approximately equal to or greater than approximately 4 mm; or greater than approximately 4 mm. In one aspect, lens 32 can comprise an overmolded lens having a lens base 36 area of approximately 30 $mm^2$ or more, for example, approximately 33.2 $mm^2$. In some aspects, lens can comprise an optical source of approximately 6 mm in diameter, disposed over and supported by an approximately 7 mm×7 mm package or submount 12. In some aspects, package 30 can provide a small optical source having a high lumen density, excellent color consistency, and superior optical control.

In some aspects, a distance D can be disposed between lens base 36 and an outermost edge of submount 12. Notably, lens 32 can comprise a large size or shape adapted to improve and/or maximize brightness and light extraction. In some aspects, lens 32 almost extends fully to outermost edges of submount 12. In some aspects, distance D can be approximately 0.05 mm or more, approximately 0.1 mm or more, approximately 0.15 mm or more, or more than 0.2 mm. In some aspects, distance D is approximately 0.25 mm.

Notably, the novel combination of LED electrical configuration, exposed metal traces, improved chip-to-chip spacing, placement of reflective material in gaps, and/or radius R of lens base 36 can contribute to improved performance of light emitter package 30. Notably, light emitter package 30 can combine high light output, reliability and efficacy to deliver up to approximately 145 or more LPW at 1 W and 25° C. and up to approximately 180 or more LPW at 1 W and 25° C. in selected color temperatures, for example in CW color temperature of approximately 6000K. Light emitter package 30 can also deliver up to approximately 200 LPW or more at 1 W and 25° C. using multiple chips provided at an improved lower cost, in part by eliminating costly materials and/or processing steps associated by using exposed metal traces and a minimal amount of solder mask disposed therebetween.

As further illustrated by FIG. 4, an optical conversion material 46 can be disposed over each LED chip 14. In some aspects optical conversion material 46 is disposed over the entire surface of each LED chips 14, such that material 46 fully covers an upper surface of each LED chip 14. Notably, optical conversion material 46 can be applied prior to die attach of each LED chip 14, thereby minimizing required processing steps, minimizing an amount of phosphor consumed, as well as reducing processing time and cost. Thus in some aspects, optical conversion material 46 may restricted to application over LED chips 14 only, and may not be applied over other package components. Optical conversion material 46 can comprise one or more binders, phosphors, lumiphors, or a phosphor or lumiphor containing material and binder applied via any suitable technique. In one aspect, optical conversion material 46 can be sprayed or dispensed over LED chips 14 prior to die attach. In one aspect, optical conversion material 46 can absorb at least some of the light emitted from LED chips 14 and can in turn emit light having a different wavelength such that light emitter package 30 emits a combination of light from the LED chips 14 and phosphor. In one aspect, light emitter package 30 can emit light that is perceived as white light of approximately 2700 to 7000 K, such as CW light around 6000 K, CW light around approximately 5500 K, neutral white light around 4100 K, or WW light around 3000 K.

In one aspect, one or more LED chips 14 selected for use can comprise wavelengths targeting cool white (CW) or warm white (WW) light upon, for example, mixing with light emitted from the phosphors or a phosphor containing material. Any suitable wavelength bin and/or phosphor combination can be selected depending upon the application and desired light emission. Phosphors can be adapted to emit light that is yellow, green, red, and/or combinations thereof upon absorbing light emitted by LED chips 14. Packages shown and described herein can be available at any color temperature and/or color temperature bin, for example CW temperatures in the E5 and E7 (e.g., a minimum of 70, 80, & 90 CRI) chromaticity bins.

In some aspects, advancements in LED chip 14 structure, chip spacing, package design, exposed metallic traces, and/or placement of reflective material can deliver the most advanced LED components in the industry, and can allow light emitter package 30 to deliver between approximately 145 LPW and 200 LPW at 1 W and 25° C. or more than 200 LPW at 1 W and 25° C. at selected color temperatures. In some aspects, light emitter packages, systems, and/or methods described herein can deliver up to approximately 2050 lm at 15 W and 25° C. in CW temperatures of around 6000 K.

In some aspects, light emitter packages and/or systems shown and described herein are ENERGY STAR® qualified and ENERGY STAR® compliant. ENERGY STAR® is an international standard for energy efficient consumer products originated in the United States of America. ENERGY STAR® qualification is awarded to only certain products that meet strict efficiency, quality, and lifetime criteria. For example, ENERGY STAR® qualified LED lighting can use at least 75% less energy than incandescent lighting, save on operating expenses, reduces maintenance costs (e.g., last 35 to 50 times longer than incandescent lighting and about 2 to 5 times longer than fluorescent lighting), and reduce cooling cost. To qualify for ENERGY STAR® certification, LED lighting products must pass a variety of tests to prove that the products will display following characteristics such as having, inter alia, (i) a brightness equal to or greater than existing lighting technologies (incandescent or fluorescent), (ii) light that is well distributed over the area lighted by the fixture, (iii) light output remains constant over time, (iv) excellent color quality with a shade of white light that appears clear and consistent over time, (v) no flicker when dimmed, and (vi) no power use when the product is turned off.

In some aspects, packages and systems shown and described herein can also be UL® recognized. That is, packages 10 and 30 as described herein can be level 4 enclosure recognized, which is the highest rating possible. Level 4 enclosure recognition indicates that light emitter packages 10 and 30 have been investigated as a fire and electrical enclosure per ANSI/UL 8750. This can advantageously save consumer's time and money, therefore, advantageously promote the adoption of LED products.

In general, light emitter packages, systems, and/or methods disclosed herein can be used in indoor and outdoor high-lumen applications including indoor directional lighting applications, outdoor lighting applications, and be adapted to provide halogen replacement lamps. For example, light emitter packages, systems, and/or methods herein can provide parabolic aluminized reflector (PAR) lamps, track lighting, GU10 halogen bulbs or products, multifaceted reflector (MR) light bulbs or products, roadway lighting, parking area lighting, high and low bay lighting, or any other high-lumen or higher efficacy LED lighting products or LED applications.

Figure 5:
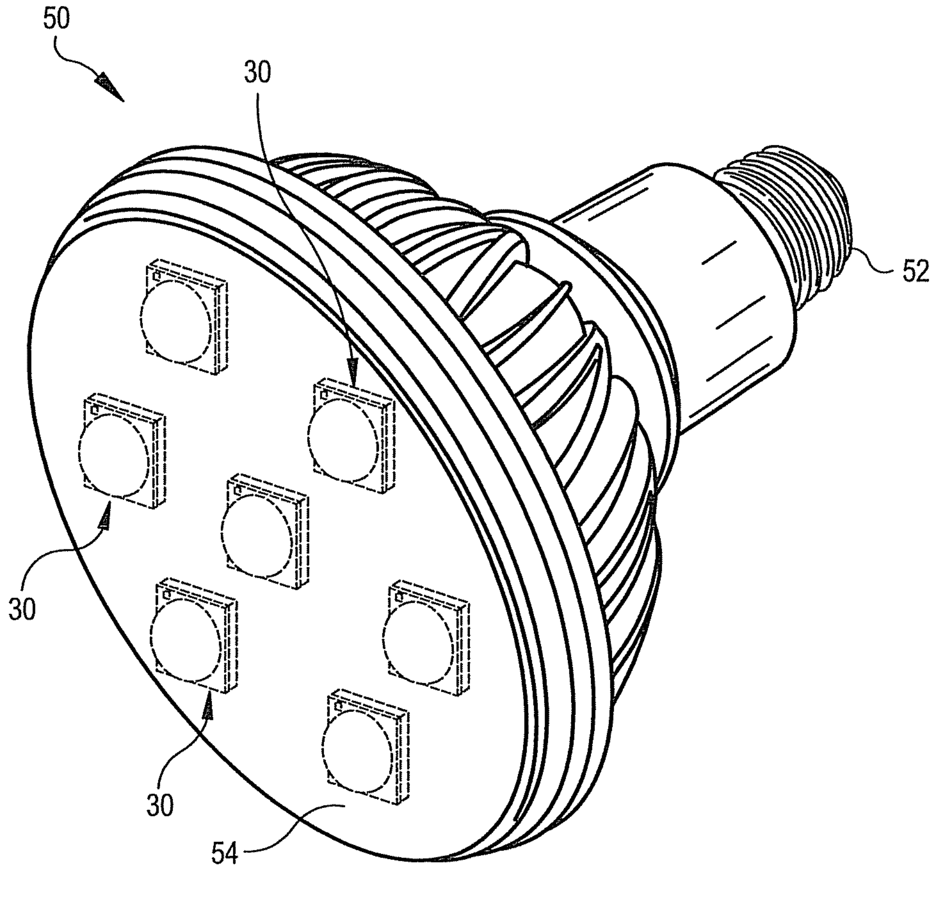
FIG. 5 illustrates a light emitter system or component incorporating one or more light emitter packages according to the disclosure herein.

FIG. 5 is a light emitter system, generally designated 50, which can incorporate one or more light emitter packages 30 according to the disclosure herein. Packages 30 are indicated in phantom lines as they may be placed within or below a portion of a lens, bulb, or other optical component of system 50, and may not be visible externally. In some aspects, only a single light emitter package 30 can be used within a single component or single system 50. That is, in some aspects, a single package 30 can be equivalent to a 60 W light bulb. In other aspects, a plurality of packages 30 can be used in system 50. Light emitter system 50 can comprise any lamp or bulb used in directional, low and high bay, roadway and parking, high end lighting, indoor lighting, outdoor lighting, portable lighting, and/or off-grid lighting. In one aspect, system 50 comprises a PAR lamp.

System 50 can comprise a base 52 adapted to plug into a socket or circuit for receiving electrical energy used for light conversion. System 50 can further include a light emitter portion 54 from which light can be emitted by one or more light emitter packages 30. Packages 30 can be oriented as shown, such that light from at least one package 30 can be directly emitted from the light emitter portion 54. In other aspects, packages 30 can be oriented towards base 52 such that light from at least one package 30 can be emitted towards base 52 and reflected back out from light emitter portion 54 via an internal reflective surface (not shown). System 50 can be configured to incorporate one, or more than one light emitter packages 30.

Notably, at least one light emitter package 30 can be used to upgrade an existing system 50, such that, for example, system 50 can be upgraded from a 60 W or 75 W equivalent lamp to a 90 W or 100 W equivalent lamp in one step. Packages 30 described herein can be more efficient at 10 W than conventional packages, and can be operable using a 12 V platform, thereby allowing for more efficient power supplies. Light emitter packages 30 can advantageously be designed to conform to existing system 50 dimensions, while being brighter and more efficient at a lower cost such that the improved packages can replace emitters within existing systems without requiring a redesign of system 50.

Figure 6:
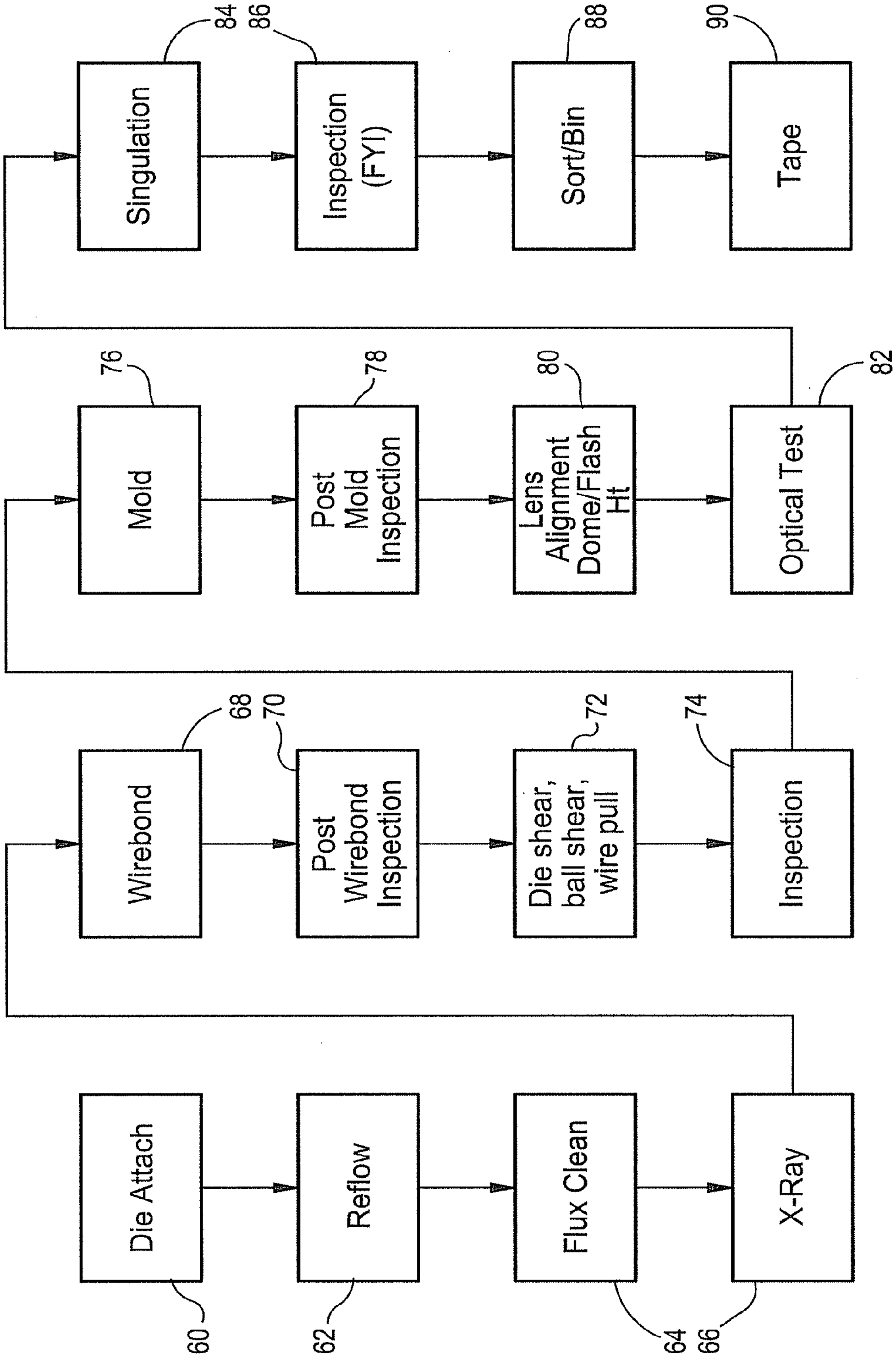
FIG. 6 illustrates a method of providing a light emitter package according to an aspect of the disclosure herein.

In some aspects, consumers can easily incorporate at least one package 30 into lighting systems, such as system 50, for an immediate boost in performance at a lower cost and/or lower power consumption. In one aspect, light emitter package 30 can be configured to drop-in to system 50 allowing for an easy upgrade to different, brighter, and/or more efficient emitter in one simple step. Packages 30 and systems described herein can be available over and/or be configured to deliver a range of color temperatures from WW to CW, for example, from approximately 2700 to 7000K. Packages 30 and systems described herein can also be available in various CRI options FIG. 6 is an embodiment of a method for providing light emitter packages and/or systems described herein. As previously described, a plurality of LED chips can be pre-applied or pre-coated with an optical conversion material, such as phosphor, prior to die attach. In step 60, the LED chips can then be die attached to a portion of traces which have been deposited, or otherwise applied, over a panel substrate of ceramic material. The panel substrate can comprise a ceramic material, such that individual package submounts can comprise the same material across the package, and may not include a package frame. The panel substrate with LED chips can subsequently be reflowed in step 62. In step 64 the panel substrate with LED chips can be cleaned to remove die attachment material, such as flux. In step 66 the panel substrate can be x-rayed for inspection purposes.

As further illustrated in step 68, LED chips can be wirebonded. At least one LED chip can be wirebonded to the cathode portion of what will be the emitter package upon singulation (e.g., step 84). In step 70, the substrate can be inspected post-wirebonding to check for adequate electrical connection between each LED chip and the traces. In step 72, at least one LED chip can be tested via die shear, ball shear, and/or wire pull testing procedures to ensure adequate chip bonding, and to assure LED chips are not from a defective batch. In step 74, the substrate can be inspected prior to molding the optical element, such as prior to molding the lens.

As illustrated in FIG. 76, a plurality of optical elements, such as lenses, can be overmolded on the panel substrate. The lenses can comprise liquid curable silicone. In step 78, each lens can be inspected post-molding to ensure that the lens is adequately molded and/or positioned thereon. In step 80, lens alignment can be verified. In step 82, the panel substrate with LED chips can be tested for optical and/or electrical properties, such as brightness and Vf.

As illustrated in step 84, individual packages can then be singulated from the panel substrate. In step 86, each package can be inspected post singulation. In step 88, each package can be sorted and binned per optical or electrical properties such as brightness, color, voltage and/or combinations thereof. In step 90, the packages can be put on tape for shipping to customers for incorporation into lighting systems.

FIGS. 7A to 9 are graphical illustrations of light output, brightness data (e.g., lumens (lms) or lumens per Watt (LPW)), and forward voltage (Vf) data associated with light emitter packages and/or systems described herein. Notably, packages disclosed herein can comprise multiple and/or a plurality of LED chips. This can contribute to packages and systems having a lower cost (e.g., not required to produce a single, high brightness chip as packages can rely on multiple chips for achieving brightness), a higher efficiency, improved optical control, a small form factor, improved reflection, as well as improved color consistency.

In some aspects, specifications for packages and/or systems described herein can include operation at a current of 700 mA and a voltage of 12 V, and a binning temperature of approximately 85° C. In other aspects, packages and/or systems described herein can include operation at 1 W and a voltage of approximately 11 to 12 V, and a binning temperature of approximately 25° C. Color targets can comprise an E2 chromaticity bin (e.g., CW, about 5700 K and about 70 CRI typical), an E5 chromaticity bin (e.g., CW or neutral white, about 4000 K and about 75 or 80 CRI typical), and/or an E7 chromaticity bin (e.g., WW, about 3000 K and about an 80 or 85 CRI typical).

FIGS. 7A and 7B illustrate distributions of brightness and Vf data for packages and/or systems having a WW color temperature in a standard CRI bin (e.g., 80 or 85 minimum and/or typical). The data in FIG. 7A depicts measurements at 700 mA and approximately 85° C. The data in FIG. 7B depicts measurements at 1 W and approximately 25° C. In some aspects, FIGS. 7A and 7B illustrate data for packages and/or systems having a WW color temperature within a standard E7 bin. As noted above, the standard E7 bin can include WW packages or systems having a color temperature of approximately 3000 K or more, and typically an 80 or 85 CRI. In some aspects, WW packages and/or systems can comprise a minimum of 80 or 85 CRI.

Referring to FIG. 7A and as the left most distribution indicates, packages disclosed herein can have a perceived output or luminous flux (Lf) of between approximately 840 and 890 lms at 700 mA and 85° C. In some aspects, packages disclosed herein can deliver more than approximately 840 lms, such as approximately 865 lms or more, approximately 870 lms or more, or more than approximately 890 lms at 700 mA and 85° C.

As the middle distribution in FIG. 7A indicates, packages having a WW color temperature can be operable at approximately 11.5 V or more, such as between approximately 11.5 and 12 Vat 700 mA and 85° C. In some aspects, packages having a WW color temperature can be operable at approximately 11.7 V on average at 700 mA and 85° C.

The distribution on the right of FIG. 7A indicates the brightness of packages and/or systems having a WW color temperature in a standard CRI bin (e.g., 80 or 85 CRI minimum and/or 80 or 85 CRI typical) when measured at 700 mA and 85° C. In some aspects, packages and/or systems having a WW color temperature can deliver more than approximately 100 LPW at 700 mA and 85° C. In some aspects, packages and/or systems having a WW color temperature can deliver more than approximately 102 LPW, more than approximately 106 LPW, or more than approximately 108 LPW at 700 mA and 85° C.

Referring now to FIG. 7B, multi-chip packages and/or systems described herein can have a perceived output or Lf of between approximately 145 and 157 lms at 1 W and 25° C. In some aspects, packages disclosed herein can deliver more than approximately 145 lms, such as approximately 150 lms or more, approximately 152 lms or more, or more than approximately 155 lms at 1 W and 25° C.

As the middle distribution in FIG. 7B indicates, packages having a WW color temperature can be operable at approximately 11 V or more, such as between approximately 11 and 12 V at 1 W and 25° C. In some aspects, packages having a WW color temperature can be operable at approximately 11.3 V on average at 1 W and 25° C.

The distribution on the right of FIG. 7B indicates brightness of packages and/or systems having a WW color temperature in a standard CRI bin at 1 W and 25° C. In some aspects, packages and/or systems having a WW color temperature can deliver more than approximately 140 LPW at 1 W and 25° C. In some aspects, packages and/or systems having a WW color temperature can deliver more than approximately 148 LPW, more than approximately 150 LPW, and/or more than approximately 155 LPW at 1 W and 25° C. In some aspects, packages and/or systems having a WW color temperature can deliver between approximately 145 LPW and 157 LPW at 1 W and 25° C., such as between approximately 150 and 157 LPW at 1 W and 25° C.

FIGS. 8A and 8B illustrate distributions of brightness and Vf data for packages and/or systems having an cool white (e.g., "CW") color temperature in a standard CRI bin (e.g., approximately 70 CRI or a minimum of 70 CRI). The data in FIG. 8A depicts measurements at approximately 700 mA and 85° C. The data in FIG. 8B depicts measurements at approximately 1 W and 25° C. In some aspects, FIGS. 8A and 8B illustrate data for packages and/or systems having a CW color temperature within a standard E2 CRI bin. As noted above, the standard E2 chromaticity bin can include CW packages or systems having a color temperature of approximately 5700 K or more, and typically 70 CRI. In some aspects, CW packages and/or systems can comprise a minimum of 70 CRI.

Referring to FIG. 8A and as the left most distribution indicates, packages disclosed herein can have a perceived output or Lf of between approximately 1050 and 1120 lms at 700 mA and 85° C. In some aspects, packages disclosed herein can deliver more than approximately 1050 lms, such as approximately 1070 lms or more, approximately 1080 lms or more, or more than approximately 1100 lms at 700 mA and 85° C.

Still referring to FIG. 8A and as the middle distribution indicates, packages having a CW color temperature can be operable at approximately 11.6 V or more, such as between approximately 11.6 and 12 V at 700 mA and 85° C. In some aspects, packages having a CW color temperature can be operable at approximately 11.8 V on average at 700 mA and 85° C.

The distribution on the right of FIG. 8A indicates brightness of packages and/or systems having a CW color temperature in a standard CRI bin (e.g., 70 CRI typical and/or minimum) at 700 mA and 85° C. In some aspects, packages and/or systems having a CW color temperature can deliver more than approximately 127 LPW at 700 mA and 85° C. In some aspects, packages and/or systems having a CW color temperature can deliver more than approximately 130 LPW, more than approximately 132 LPW, or more than approximately 135 LPW at 700 mA and 85° C.

Referring now to FIG. 8B, lower cost, more efficient multi-chip packages and/or systems described herein can have a perceived output or Lf of between approximately 180 and 193 lms at 1 W and 25° C. In some aspects, packages disclosed herein can deliver more than approximately 182 lms, such as approximately 185 lms or more, approximately 188 lms or more, or more than approximately 190 lms at 1 W and 25° C.

As the middle distribution of FIG. 8B indicates, packages and/or systems having a CW color temperature can be operable at approximately 11.3 V or more, such as between approximately 11.3 and 11.7 V at 1 W and 25° C. In some aspects, packages having a CW color temperature can be operable at approximately 11.5 V on average at 1 W and 25° C.

The distribution on the right of FIG. 8B indicates brightness of packages and/or systems having a CW color temperature binned at 1 W and 25° C. In some aspects, packages and/or systems having a CW color temperature can deliver more than approximately 180 LPW at 1 W and 25° C. In some aspects, packages and/or systems having a CW color temperature can deliver more than approximately 182 LPW, more than approximately 184 LPW, and/or more than approximately 186 LPW at 1 W and 25° C. In some aspects, packages and/or systems having a CW color temperature can deliver between approximately 180 LPW and 192 LPW at 1 W and 25° C., such as between approximately 182 and 192 LPW at 1 W and 25° C.

Figure 9:
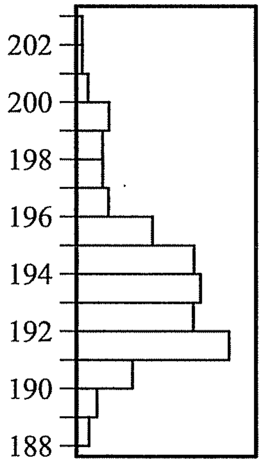

FIG. 9 illustrates a further distribution of brightness, for packages and/or systems described herein as measured at 1 W and approximately 25° C. In some aspects, packages having characteristics similar to that shown in FIG. 9 can comprise multiple novel LED chips as described in, for example, co-pending and commonly assigned U.S. patent application Ser. No. 13/168,689 which has been previously incorporated by reference herein. In some aspects, LED chips used within packages can have a distribution similar to FIG. 9 having improved barrier layers as described in FIG. 14 of co-pending and commonly assigned U.S. patent application Ser. No. 13/168,689.

As FIG. 9 indicates, novel light emitter packages and/or systems as described herein can deliver more than approximately 200 LPW at 1 W and 25° C. at selected color temperatures, such as CW color temperatures. As FIG. 9 illustrates, packages and/or systems having a CW color temperature can deliver more than approximately 188 LPW, more than approximately 194 LPW, and/or more than approximately 198 LPW at 1 W and 25° C. In some aspects, packages and/or systems having a CW color temperature can deliver between approximately 188 LPW and 203 LPW at 1 W and 25° C., such as between approximately 192 and 203 LPW at 1 W and 25° C. Notably, such packages and/or systems can exhibit improved brightness, light extraction, and overall improved optical properties.

Embodiments as disclosed herein may provide one or more of the following beneficial technical effects: reduced cost of manufacturing light emitter packages; improved brightness from light emitter packages; improved light extraction from light emitter packages; reduced processing time associated with manufacturing light emitter packages; reduced materials required for producing light emitter packages; improved optical control; small footprint providing a narrow beam for improved optical control; improved two-step binning; 100+ LPW high lumen directional systems; small optical source having a high lumen density; excellent color consistency; use as a single component in indoor directional lighting applications which better emulates the single filament appearance of incumbent lighting products than multiple package designs; improved, smaller form factor; improved indoor and outdoor directional lighting systems; and/or improved thermal properties of light emitter packages.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present invention, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A light emitter package comprising:

a submount comprising a planar surface and at least one layer of exposed metal disposed on the planar surface of the submount;

a plurality of light emitter chips disposed over the submount; and a lens disposed over the submount, the lens comprising a lens base;

wherein the layer of exposed metal is disposed at least substantially over a portion of the planar surface that is outside of the lens base, wherein the planar surface comprises a surface area, and wherein the layer of exposed metal does not extend beyond the surface area of the submount.

2. The light emitter package of claim 1, wherein the package delivers up to approximately 145 or more lumens per watt (LPW) at 1 W and approximately 25° C.

3. The light emitter package of claim 1, wherein the package delivers up to approximately 180 or more lumens per watt (LPW) at 1 W and approximately 25° C.

4. The light emitter package of claim 1, wherein the package delivers up to approximately 200 or more lumens per watt (LPW) at 1 W and approximately 25° C.

5. The light emitter package of claim 2, wherein the plurality of light emitter chips emit light, and wherein a combined light emission from the plurality of light emitter chips is a warm white (WW) color temperature.

6. The light emitter package of claim 3, wherein the plurality of light emitter chips emit light, and wherein a combined light emission from the plurality of light emitter chips is a cool white (CW) color temperature.

7. The light emitter package of claim 4, wherein the plurality of light emitter chips emit light, and wherein a combined light emission from the plurality of light emitter chips is a cool white (CW) color temperature.

8. The light emitter package of claim 1, wherein the package delivers approximately 2050 lumens (lm) at 15 W and 25° C. in CW temperatures.

9. The light emitter package of claim 1, wherein each chip of the plurality of chips is spaced apart from at least one other adjacent chip by at least approximately 0.06 mm or more.

10. The light emitter package of claim 1, wherein the layer of exposed metal comprises an anode and a cathode.

11. The light emitter package of claim 10, wherein a portion of reflective material is at least partially disposed between the anode and the cathode.

12. The light emitter package of claim 10, wherein a first light emitter chip is entirely disposed over the cathode.

13. The light emitter package of claim 12, wherein a second light emitter chip is wirebonded to the anode.

14. The light emitter package of claim 1, wherein an optical conversion material is disposed directly over portions of each light emitter chip.

15. The light emitter package of claim 1, wherein the exposed metal comprises copper (Cu).

16. The light emitter package of claim 1, wherein the exposed metal comprises copper (Cu), silver (Ag), and Titanium (Ti).

17. The light emitter package of claim 1, wherein the lens base comprises a circle.

18. The light emitter package of claim 17, wherein the lens base comprises a radius equal to or greater than approximately 1 mm.

19. The light emitter package of claim 17, wherein the lens base comprises a radius equal to or greater than approximately 3.25 mm.

20. The light emitter package of claim 1, wherein the submount comprises a length and a width of approximately 4 mm or more.

21. The light emitter package of claim 20, wherein the submount comprises a length and a width of approximately 7 mm.

22. The light emitter package of claim 1, wherein the light emitter chip comprises an area of at least 1.8 $mm^2$.

23. The light emitter package of claim 22, wherein the surface area comprises an area of approximately 49 $mm^2$ or more.

24. The light emitter package of claim 22, wherein the lens base comprises an area of approximately 30 $mm^2$ or more.

25. The light emitter package of claim 1, wherein the submount comprises a thermal conductivity equal to or greater than approximately 30 watts per meter kelvin (W/m·K).

26. The light emitter package of claim 1, wherein the package is ENERGY STAR® compliant.

27. The light emitter package of claim 1, wherein the package is UL® recognized.

* * * * *